(12) United States Patent
Kim et al.

(10) Patent No.: US 12,356,783 B2
(45) Date of Patent: Jul. 8, 2025

(54) LIGHT EMITTING DEVICE FOR DISPLAY AND UNIT PIXEL HAVING THE SAME

(71) Applicant: SEOUL VIOSYS CO., LTD., Ansan-si (KR)

(72) Inventors: Chae Hon Kim, Ansan-si (KR); So Ra Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/661,054

(22) Filed: May 10, 2024

(65) Prior Publication Data

US 2024/0297208 A1  Sep. 5, 2024

Related U.S. Application Data

(63) Continuation of application No. 18/135,169, filed on Apr. 16, 2023, now Pat. No. 12,027,571, which is a continuation of application No. 17/128,163, filed on Dec. 20, 2020, now Pat. No. 11,631,714.

(60) Provisional application No. 62/954,617, filed on Dec. 29, 2019.

(51) Int. Cl.
 *H10H 29/14* (2025.01)
 *H10H 20/824* (2025.01)
 *H10H 20/85* (2025.01)

(52) U.S. Cl.
 CPC ........ *H10H 29/142* (2025.01); *H10H 20/824* (2025.01); *H10H 20/8506* (2025.01)

(58) Field of Classification Search
 CPC ..... H01L 27/156; H01L 33/30; H01L 33/486; H01L 33/54; H01L 25/0753; H10H 29/142; H10H 20/824; H10H 20/8506; H10H 20/853; H10H 25/0753
 See application file for complete search history.

(56) References Cited

U.S. PATENT DOCUMENTS

| | | | |
|---|---|---|---|
| 6,687,280 B1 | 2/2004 | Kajita | |
| 9,076,929 B2 | 7/2015 | Katsuno et al. | |
| 9,281,445 B2 * | 3/2016 | Donofrio | H01L 33/22 |
| 9,337,400 B2 | 5/2016 | Hashimoto et al. | |

(Continued)

FOREIGN PATENT DOCUMENTS

| | | |
|---|---|---|
| KR | 10-2019-0054461 | 5/2019 |
| KR | 10-2019-0126261 | 11/2019 |

(Continued)

OTHER PUBLICATIONS

International Search Report dated Apr. 19, 2021, issued in International Patent Application No. PCT/KR2020/019117.

(Continued)

*Primary Examiner* — Jonathan Han
(74) *Attorney, Agent, or Firm* — Oblon, McClelland, Maier & Neustadt, L.L.P.

(57) ABSTRACT

A light emitting device for a display including a light emitting structure including a first conductivity type semiconductor layer, an active layer, and a second conductivity type semiconductor layer, and having a side surface exposing the active layer, in which a portion of the second conductivity type semiconductor layer and the active layer along an edge of the light emitting structure is insulative in a thickness direction to define an insulation region, and the insulation region includes implanted ions.

20 Claims, 19 Drawing Sheets

(56) References Cited

U.S. PATENT DOCUMENTS

| 10,748,881 | B2 | 8/2020 | Kim et al. |
| 2009/0078955 | A1 | 3/2009 | Fan et al. |
| 2017/0288093 | A1 | 10/2017 | Cha et al. |
| 2017/0294418 | A1* | 10/2017 | Edmond ................. H01L 33/62 |
| 2019/0371964 | A1 | 12/2019 | Bour et al. |
| 2020/0203586 | A1 | 6/2020 | Kimura et al. |

FOREIGN PATENT DOCUMENTS

| KR | 10-2125313 | 6/2020 |
| KR | 10-2020-0079122 | 7/2020 |
| WO | 2019-112304 | 6/2019 |

OTHER PUBLICATIONS

Non-Final Office Action dated Aug. 3, 2022, issued to U.S. Appl. No. 17/128,163.
Notice of Allowance dated Dec. 12, 2022, issued to U.S. Appl. No. 17/128,163.

* cited by examiner

LIGHT EMITTING DEVICE FOR DISPLAY AND UNIT PIXEL HAVING THE SAME

CROSS REFERENCE TO RELATED APPLICATIONS

This application is a continuation of U.S. patent application Ser. No. 18/135,169, filed Apr. 16, 2023, which is a continuation of U.S. patent application Ser. No. 17/128,163, filed on Dec. 20, 2020, now U.S. Pat. No. 11,631,714, issued Apr. 18, 2023, which claims the benefit of U.S. Provisional Patent Application No. 62/954,617, filed on Dec. 29, 2019, each of which is hereby incorporated by reference for all purposes as if fully set forth herein.

BACKGROUND

Field

Exemplary embodiments of the invention relate to a display apparatus, and, more specifically, to a light emitting device for a display for preventing non-radiative surface recombination, a unit pixel, a pixel module, and a display apparatus having the same.

Discussion of the Background

As an inorganic light source, light emitting diodes have been used in various fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been used as backlight light sources in display apparatuses. However, LED displays that directly display images using the light emitting diodes have been recently developed.

In general, a display apparatus realizes various colors through mixture of blue, green, and red light. To display various images, the display apparatus includes a plurality of pixels each including sub-pixels corresponding to blue, green, and red light, respectively. In this manner, a color of a certain pixel is determined based on the colors of the sub-pixels so that images can be displayed through combination of such pixels.

Since LEDs can emit light of various colors depending on materials thereof, individual LED chips emitting blue, green, and red colors may be arranged on a two-dimensional plane to provide a display apparatus. However, the size of a micro LED is very small, for example, 200 microns or less, further 100 microns or less, and thus, various problems may occur due to the small size thereof. In particular, since handling of the light emitting diode having a small size is difficult, it is not easy to directly mount the light emitting diode on a display panel.

Moreover, the micro LEDs are generally operated under a current density with low luminous efficiency. Since non-radiative surface recombination is not saturated under low current density, it is typically very difficult to increase luminous efficiency. In addition, the non-radiative surface recombination may have a greater effect in the micro LEDs due to the small size thereof. In particular, since a GaAs or GaP-based red LED has a large carrier diffusion distance, the reduction in quantum efficiency due to non-radiative surface recombination needs to be addressed.

The above information disclosed in this Background section is only for understanding of the background of the inventive concepts, and, therefore, it may contain information that does not constitute prior art.

SUMMARY

Light emitting devices for a display constructed according to exemplary embodiments of the invention are capable of preventing current leakage due to non-radiative surface recombination and a display apparatus having the same.

Exemplary embodiments also provide a unit pixel capable of reducing a time associated with a mounting process and a display apparatus having the same.

Exemplary embodiments further provide a unit pixel capable of being mounted on a circuit board and a display apparatus having the same.

Additional features of the inventive concepts will be set forth in the description which follows, and in part will be apparent from the description, or may be learned by practice of the inventive concepts.

A light emitting device for a display according to an exemplary embodiment includes a light emitting structure including a first conductivity type semiconductor layer, an active layer, and a second conductivity type semiconductor layer, and having a side surface exposing the active layer, in which a portion of the second conductivity type semiconductor layer and the active layer along an edge of the light emitting structure is insulative in a thickness direction to define an insulation region, and the insulation region includes implanted ions.

The insulation region may include a side surface of the active layer.

The insulation region may have substantially a ring shape along the edge of the light emitting structure.

The insulation region may include at least a portion of the first conductivity type semiconductor layer.

The light emitting device may further include a mesa disposed on a partial region of the first conductivity type semiconductor layer, the mesa including the second conductivity type semiconductor layer and the active layer, in which the insulation region may include at least a portion of a side surface of the mesa.

A portion of the side surface of the mesa may be spaced apart from the insulation region and be covered with a surface protection layer.

The surface protection layer may include at least one of $Al_2O_3$, $SiN_x$, and $SiO_2$.

The light emitting structure may not include a growth substrate.

The light emitting device may be configured to emit red light.

The light emitting device may further include a first LED stack including the light emitting structure, a second LED stack disposed under the first LED stack and configured to emit blue light, and a third LED stack located under the second LED stack and configured to emit green light.

A light emitting device for a display according to another exemplary embodiment includes a light emitting structure including a first conductivity type semiconductor layer, a second conductivity type semiconductor layer, an active layer disposed between the first conductivity type semiconductor layer and the second conductivity type semiconductor layer, and an oxidation region forming layer interposed between the second conductivity type semiconductor layer and the active layer, in which the light emitting structure includes a side surface exposing the active layer, and the oxidation region forming layer includes an oxidized region on the side surface of the light emitting structure.

The oxidation region forming layer may include a group III-V compound semiconductor including Al.

The oxidized region may have substantially a ring shape.

The light emitting structure may configured to emit red light.

The light emitting device may further include a first LED stack including the light emitting structure, a second LED stack disposed under the first LED stack and configured to emit blue light, and a third LED stack disposed under the second LED stack and configured to emit green light.

A unit pixel according to still another exemplary embodiment includes a first light emitting device, a second light emitting device, and a third light emitting device configured to emit light of different colors, in which each of the first, second, and third light emitting devices includes a light emitting structure including a first conductivity type semiconductor layer, an active layer, and a second conductivity type semiconductor layer, and having a side surface, a portion of the second conductivity type semiconductor layer and the active layer of at least one of the first, second, and third light emitting devices is insulative along an edge of the corresponding light emitting structure to define an insulation region, and the insulation region includes implanted ions.

The first, second, and third light emitting devices may be arranged in a lateral direction in a plan view.

Thee first, second, and third light emitting devices may be stacked in a vertical direction.

A light emitting device for a display according to yet another exemplary embodiment includes a first light emitting device, a second light emitting device, and a third light emitting device configured to emit light of different colors, in which each of the first, second, and third light emitting devices includes a light emitting structure including a first conductivity type semiconductor layer, an active layer, and a second conductivity type semiconductor layer, and having a side surface, the light emitting structure of the first light emitting device further includes an oxidation region forming layer interposed between the second conductivity type semiconductor layer and the active layer, the side surface of the light emitting structure of the first light emitting device exposes the corresponding active layer, and the oxidation region forming layer includes an oxidized region near the side surface of the light emitting structure of the first light emitting device.

The first, second, and third light emitting devices may be stacked in the vertical direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
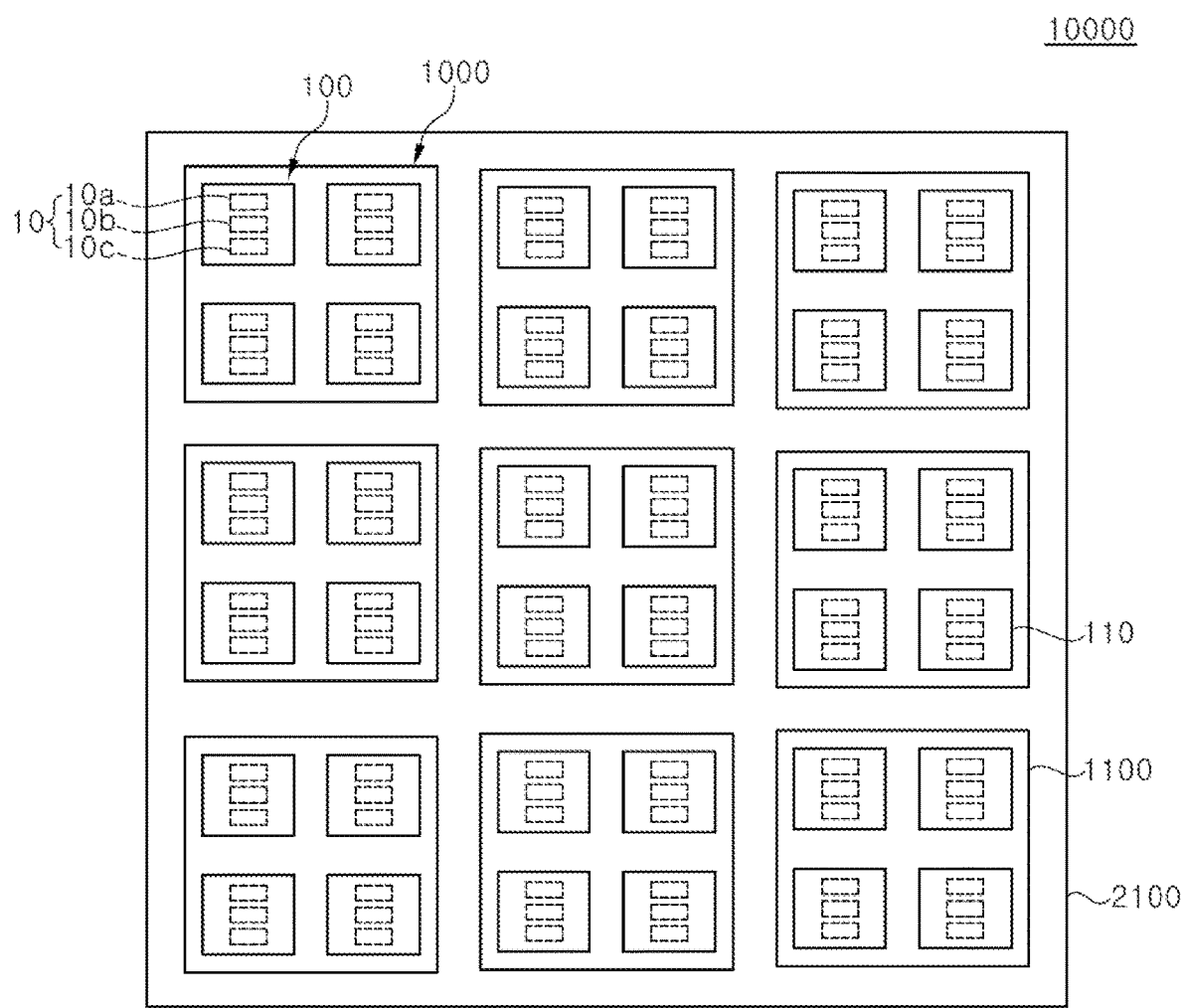
FIG. 1 is a schematic plan view of a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings.

FIG. 1 is a schematic plan view of a display apparatus 10000 according to an exemplary embodiment. The display apparatus 10000 may be a micro LED display apparatus, which may include a VR display apparatus such as a smart watch, a VR headset, or an AR display apparatus such as augmented reality glasses.

Referring to FIG. 1, the display apparatus 10000 includes a panel substrate 2100 and a plurality of pixel modules 1000. The panel substrate 2100 may include a circuit for a passive matrix driving or active matrix driving. In an exemplary embodiment, the panel substrate 2100 may include interconnection lines and resistors therein, and, in another exemplary embodiment, the panel substrate 2100 may include interconnection lines, transistors, and capacitors. The panel substrate 2100 may also have pads disposed on an upper surface thereof to allow electrical connection to the circuit therein.

A plurality of pixel modules 1000 is arranged on the panel substrate 2100. Each pixel module 1000 may include a circuit board 1001 (see FIG. 5A) and a plurality of unit pixels 100 disposed on the circuit board 1001.

Each unit pixel 100 includes a plurality of light emitting devices 10 (10a, 10b, and 10c). The light emitting devices 10 may include light emitting devices 10a, 10b, and 10c that emit light of different colors from each other. The light emitting devices 10a, 10b, and 10c in each unit pixel 100 may be linearly arranged as shown in FIG. 1. In particular, the light emitting devices 10a, 10b, and 10c may be arranged in a vertical direction with respect to a display screen on which the image is displayed.

Hereinafter, each element of the display apparatus 10000 will be described in detail in the order of the light emitting device 10, the unit pixel 100, and the pixel module 1000 that are disposed in the display apparatus 10000.

Figure 2A:
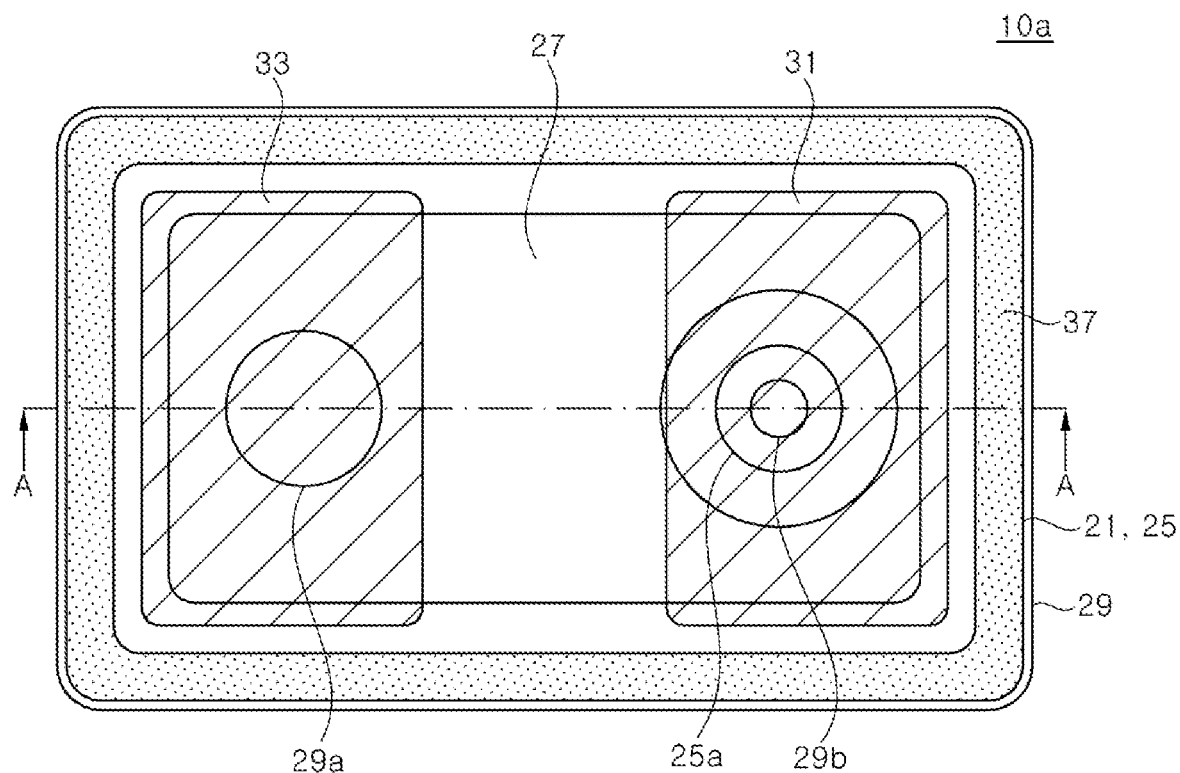
FIG. 2A is a schematic plan view of a light emitting device according to an exemplary embodiment.
Figure 2B:
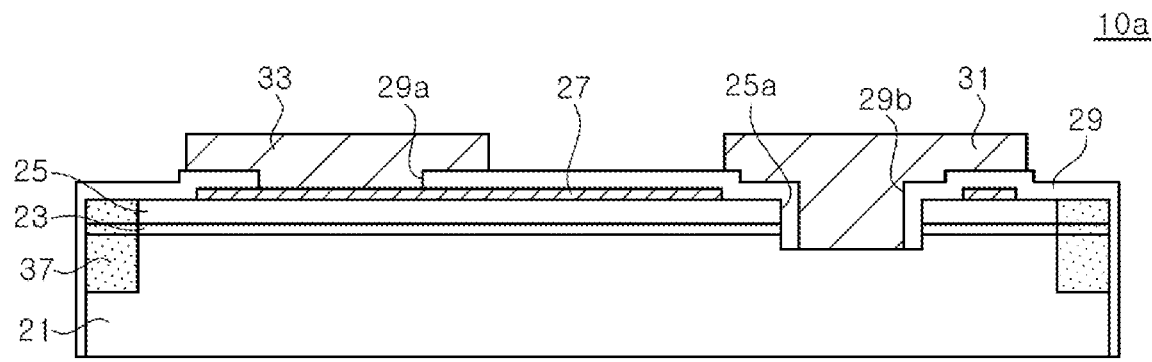
FIG. 2B is a schematic cross-sectional view taken along line A-A of FIG. 2A.
Figure 3A:
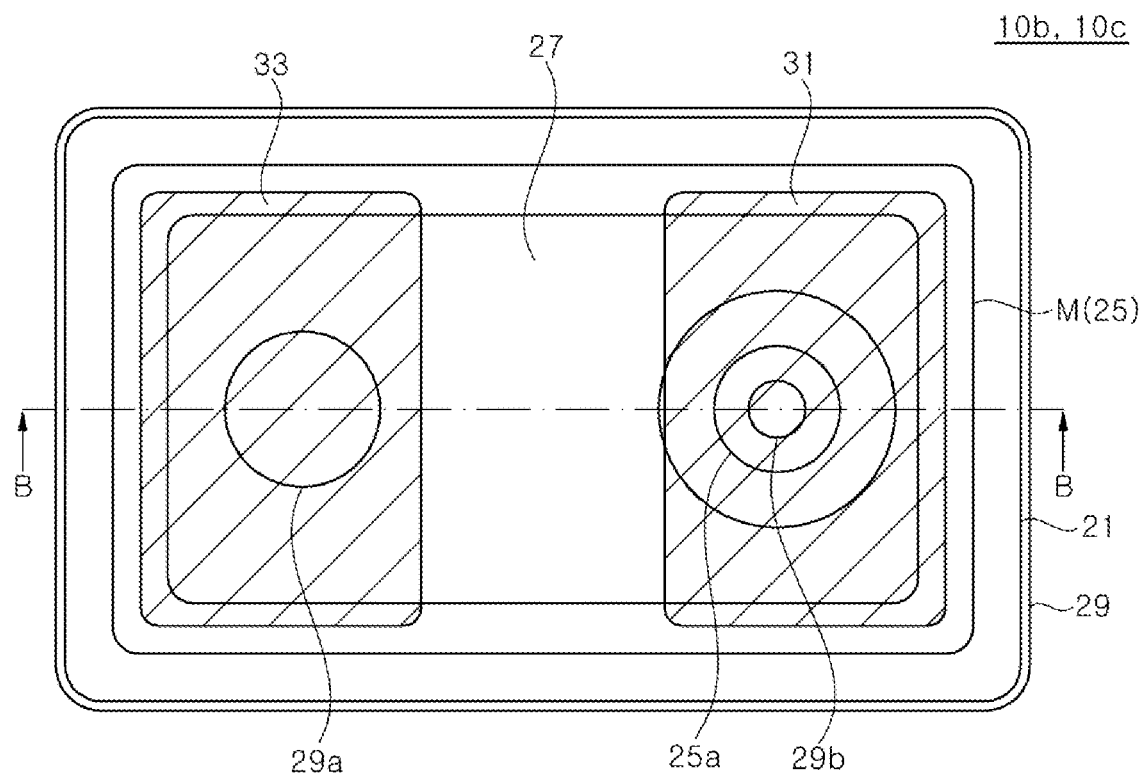
FIG. 3A is a schematic plan view of a light emitting device according to an exemplary embodiment.
Figure 3B:
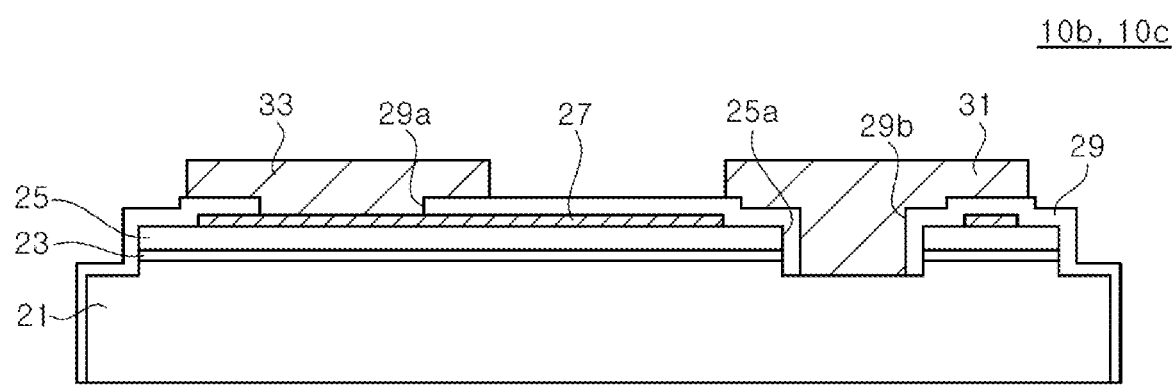
FIG. 3B is a schematic cross-sectional view taken along line B-B of FIG. 3A.

FIG. 2A is a schematic plan view of a light emitting device 10a according to an exemplary embodiment, and FIG. 2B is a schematic cross-sectional view taken along line A-A of FIG. 2A. FIG. 3A is a schematic plan view illustrating light emitting devices 10b and 10c according to an exemplary embodiment, and FIG. 3B is a schematic cross-sectional view taken along line B-B of FIG. 3A.

Referring to FIGS. 2A and 2B, the light emitting device 10a includes a light emitting structure including a first conductivity type semiconductor layer 21, an active layer 23, and a second conductivity type semiconductor layer 25. The light emitting structure also includes an insulation region 37, which may be formed by ion implantation. Further, the light emitting device 10a may include an ohmic contact layer 27, an insulation layer 29, a first electrode pad 31, and a second electrode pad 33.

The first conductivity type semiconductor layer 21, the active layer 23, and the second conductivity type semiconductor layer 25 of the light emitting device 10a may be grown on a substrate. The substrate may be any substrate known in the art that may be used to grow semiconductors, such as a GaAs substrate, a Si substrate, or the like. A growth substrate may be removed from the semiconductor layers using techniques, such as mechanical polishing, chemical etching, or the like.

In an exemplary embodiment, the light emitting device 10a may emit red light, and the semiconductor layers may include gallium arsenide (AlGaAs), gallium arsenide phosphide (GaAsP), aluminum gallium indium phosphide (AlGaInP), or gallium phosphide (GaP).

The first conductivity type and the second conductivity type have opposite polarities from each other. For example, when the first conductivity type is an n-type, the second conductivity type may be a p-type, and when the second conductivity type is a p-type, the second conductivity type may be an n-type.

The first conductivity type semiconductor layer 21, the active layer 23, and the second conductivity type semiconductor layer 25 may be grown on the substrate in a chamber using a process known in the art, such as molecular beam epitaxy, metal organic chemical vapor deposition (MOCVD), or the like. In an exemplary embodiment, the first conductivity type semiconductor layer 21 may include n-type impurities (e.g., Si, Ge, and Sn), and the second conductivity type semiconductor layer 25 may include p-type impurities (e.g., Mg, Sr, and Ba).

Although each the first conductivity type semiconductor layer 21 and the second conductivity type semiconductor layer 25 is exemplarily shown as a single layer in the drawings, each the first conductivity type semiconductor layer 21 and the second conductivity type semiconductor layer 25 may be formed as multiple layers, and may also include a superlattice layer. The active layer 23 may include a single quantum well structure or a multiple quantum well structure, and a composition ratio of a nitride-based semiconductor may be adjusted to emit light of a desired wavelength. For example, the active layer 23 of the light emitting device 10a according to an exemplary embodiment may emit red light.

The first conductivity type semiconductor layer 21 may have a concave-convex pattern from surface texturing. Surface texturing may be performed by patterning, for example, using a dry etching process. For example, cone-shaped protrusions may be formed on the first conductivity type semiconductor layer 21, and an elevation of the cone may be about 2.5 µm to about 3 µm, a distance between the cones may be about 1.5 µm to about 2 µm, and a diameter of a bottom of the cone may be about 3 µm. In this manner, color difference may be reduced by forming the concave-convex pattern on the surface of the first conductivity type semiconductor layer 21. When the first, second, and third light emitting devices 10a, 10b, and 10c are linearly arranged in the unit pixel 100 to be described later, color difference between the left and right color may be reduced by forming the textured surface on the first conductivity type semiconductor layer 21 as described above.

The active layer 23 and the second conductivity type semiconductor layer 25 are disposed on the first conductivity type semiconductor layer 21. A through hole 25a may pass through the active layer 23 and the second conductivity type semiconductor layer 25 to expose the first conductivity type semiconductor layer 21.

The insulation region 37 may be disposed along an edge of the light emitting structure. The insulation region 37 may be formed by ion implantation, and a semiconductor region may be converted into an insulation region by ion implantation. The insulation region 37 may be continuously formed along the edge of the light emitting structure, but the inventive concepts are not limited thereto. In some exemplary embodiment, the insulation region 37 may be formed in a partial region of the light emitting structure. The insulation region 37 may be formed over the second conductivity type semiconductor layer 25 and the active layer 23, and may also be formed in the first conductivity type semiconductor layer 21. Further, the insulation region 37 may be formed to a partial thickness of the first conductivity type semiconductor layer 21, but the inventive concepts are not limited thereto. In some exemplary embodiments, the insulation region 37 may be formed over an entire thickness of the first conductivity type semiconductor layer 21. The insulation region 37 defines a light emitting region in the active layer 23 in which electrons and holes can be combined. Further, the insulation region 37 may prevent carriers from moving to the edge of the light emitting structure, and prevent non-radiative recombination from occurring on the surface of the light emitting structure. In the GaAs or GaP-based red LED or green LED, the insulation region 37 may particularly prevent non-radiative surface recombination, thereby improving luminous efficiency.

The ohmic contact layer 27 is disposed on the second conductivity type semiconductor layer 25 to be in ohmic contact with the second conductivity type semiconductor layer 25. The ohmic contact layer 27 may be formed of a single layer or multiple layer, and may be formed of a transparent conductive oxide layer or a metallic layer. The transparent conductive oxide layer may include ITO or ZnO, and the metallic layer may include metal, such as Al, Ti, Cr, Ni, and Au, or an alloy thereof.

The insulation layer 29 covers the ohmic contact layer 27. Furthermore, the insulation layer 29 may cover a side surface of the light emitting structure. The insulation layer 29 may also cover a sidewall in the through hole 25a. The insulation layer 29 may have an opening 29a exposing the ohmic contact layer 27 and an opening 29b exposing the first conductivity type semiconductor layer 21 in the through hole 25a. The insulation layer 29 may be formed of a single layer or multiple layer of an aluminum oxide film, a silicon oxide film, or a silicon nitride film. Further, the insulation layer 29 may include an insulating reflector, such as a distributed Bragg reflector.

The insulation layer 29 may function as a surface protection layer to prevent non-radiative surface recombination, which may occur in an inner wall of the through hole 25a. For example, after forming the through hole 25a, chemical treatment may be performed to remove surface defects formed on the inner wall of the through hole 25a. In particular, the inner wall of the through hole 25a in the light emitting device 10a may be surface-treated using, for example, a diluted HF solution or a diluted Cl solution. A sidewall of the surface-treated through hole 25a may be covered with an aluminum oxide film, a silicon oxide film, or a silicon nitride film, thereby suppressing non-radiative surface recombination.

The first electrode pad 31 and the second electrode pad 33 are disposed on the insulation layer 29. The second electrode pad 33 may be electrically connected to the ohmic contact layer 27 through the opening 29a, and the first electrode pad 31 may be electrically connected to the first conductivity type semiconductor layer 21 through the opening 29b.

The first and/or second electrode pads 31 and 33 may be formed of a single layer or a multiple layer including metal. For example, the first and/or second electrode pads 31 and 33 may include metal, such as Al, Ti, Cr, Ni, Au, or the like, and an alloy thereof.

Although the light emitting device 10a according to the illustrated exemplary embodiment has been briefly described above, the light emitting device 10a may further include a layer having additional functions in addition to the above-described layers. For example, various layers, such as a reflective layer for reflecting light, an additional insulation layer for insulating a specific element, and a solder preventing layer for preventing diffusion of solder may be further included.

When the light emitting device is formed as a flip chip type, locations and shapes of the first and second electrode pads 31 and 33 may be variously modified. In addition, the ohmic contact layer 27 may be omitted, and the second electrode pad 33 may directly contact the second conductivity type semiconductor layer 25. Although the first electrode pad 31 is exemplarily shown as being directly connected to the first conductivity type semiconductor layer 21, in some exemplary embodiments, a contact layer may be formed on the first conductivity type semiconductor layer 21 exposed to the through hole 29b, and the first electrode pad 31 may be connected to the contact layer.

Referring to FIGS. 3A and 3B, the light emitting devices 10b and 10c have a structure substantially similar to that of the light emitting device 10a. As such, repeated descriptions of substantially similar elements already described above will be omitted, and differences between the light emitting devices 10b and 10c and the light emitting devices 10a will be mainly described.

When the light emitting device 10b emits green light, for example, semiconductor layers thereof may include indium gallium nitride (InGaN), gallium nitride (GaN), gallium phosphide (GaP), aluminum gallium indium phosphide (AlGaInP), or aluminum gallium phosphide (AlGaP).

When the light emitting device 10c emits blue light, for example, semiconductor layer thereof may include gallium nitride (GaN), indium gallium nitride (InGaN), or zinc selenide (ZnSe).

In the light emitting devices 10b and 10c according to an exemplary embodiment, the second conductivity type semiconductor layer 25 and the active layer 23 may have a mesa M structure, which may be disposed on the first conductivity type semiconductor layer 21. The mesa M may include the second conductivity type semiconductor layer 25 and the active layer 23, and may include a portion of the first conductivity type semiconductor layer 21 as shown in FIG. 3B. The mesa M may be located on a partial region of the first conductivity type semiconductor layer 21, and an upper surface of the first conductivity type semiconductor layer 21 may be exposed around the mesa M.

A side surface of the mesa M and the inner wall of the through hole 25a may be surface-treated by chemical etching, and the insulation layer 29 may function as a surface protection layer. For example, the side surface of the mesa M may be surface-treated using a basic etching solution, such as KOH, tetramethylammonium hydroxide (TMAH), NaOH, or the like.

In the illustrated exemplary embodiment, the light emitting devices 10b and 10c do not include an insulation region 37. However, the inventive concepts are not limited thereto, and the light emitting devices 10b and 10c may also include the insulation region 37 in other exemplary embodiments. In particular, when the green light emitting device 10b is GaP-based, the light emitting device 10b may include the insulation region 37 as in the light emitting device 10a described above with reference to FIGS. 2A and 2B.

Figure 4A:
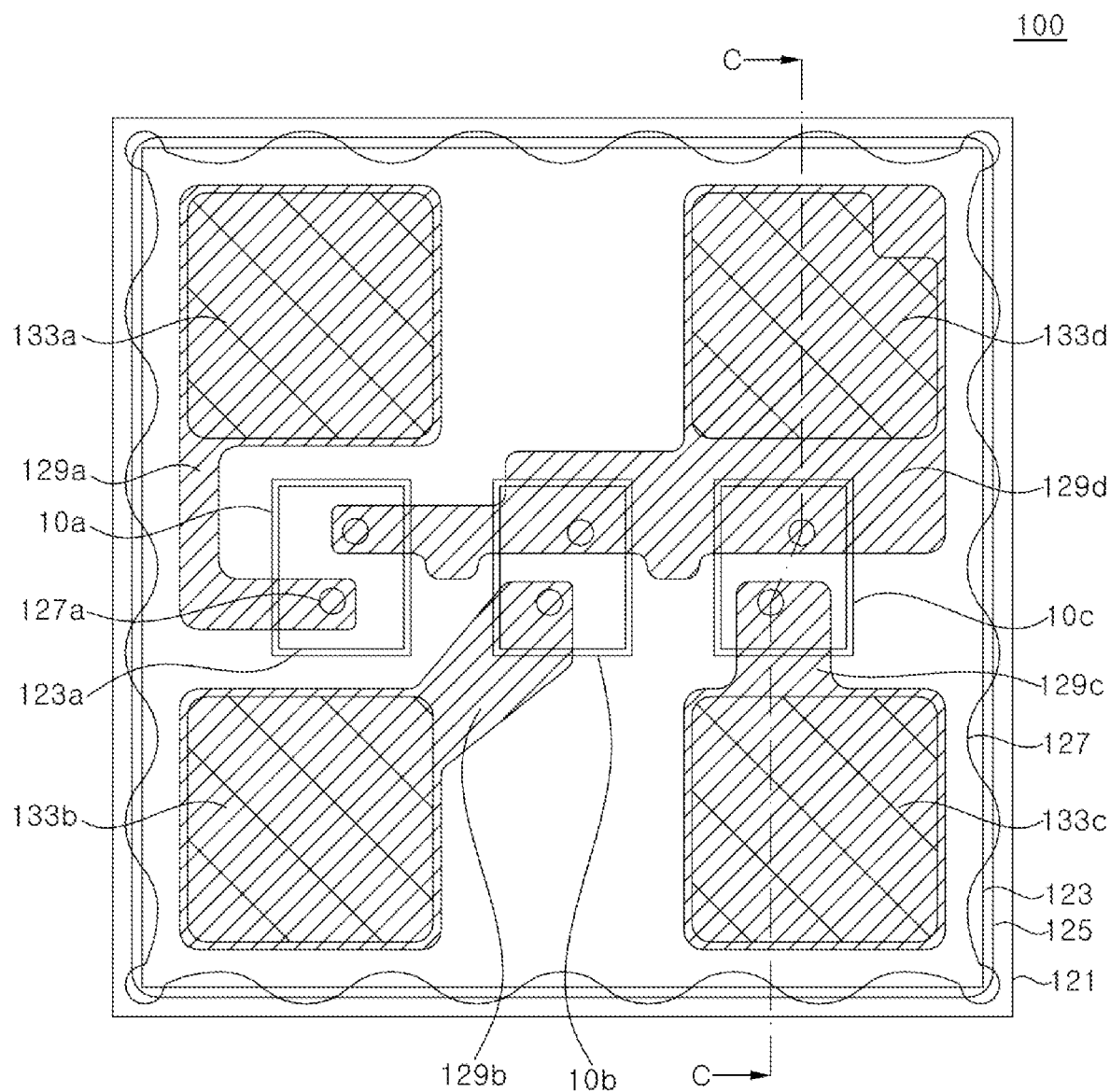
FIG. 4A is a schematic plan view of a unit pixel according to an exemplary embodiment.
Figure 4B:
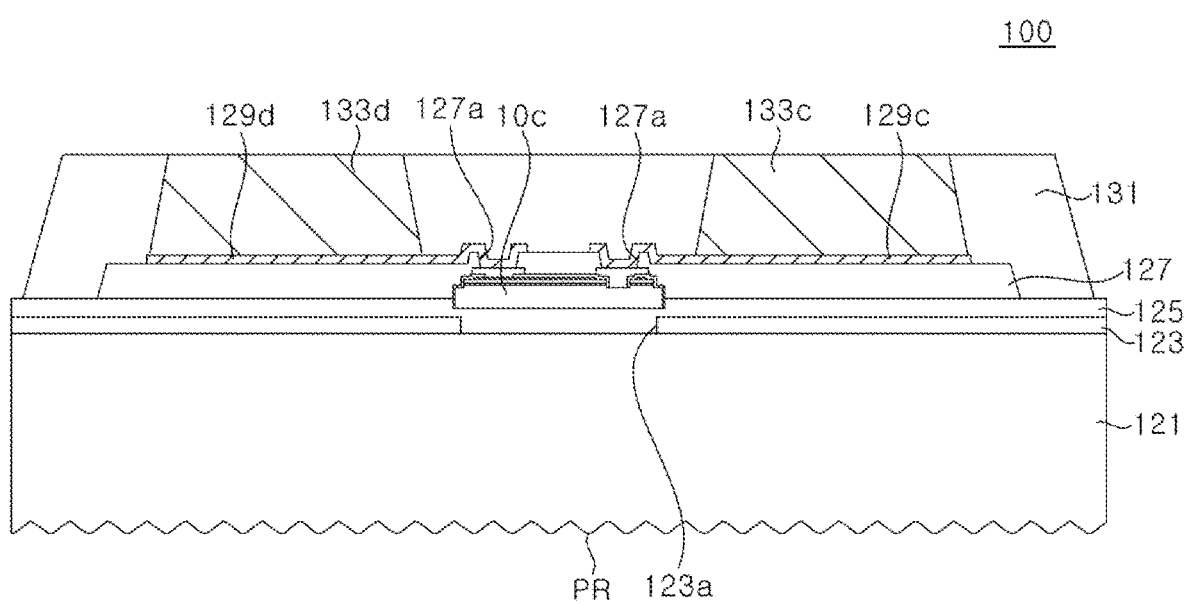
FIG. 4B is a schematic cross-sectional view taken along line C-C of FIG. 4A.

FIG. 4A is a schematic plan view of a unit pixel 100 according to an exemplary embodiment, and FIG. 4B is a schematic cross-sectional view taken along line C-C of FIG. 4A.

Referring to FIGS. 4A and 4B, the unit pixel 100 may include a transparent substrate 121, first, second, and third light emitting devices 10a, 10b, and 10c, a light blocking layer 123, and an adhesive layer 125, a step adjustment layer 127, connection layers 129a, 129b, 129c, and 129d, bumps 133a, 133b, 133c, and 133d, and a protection layer 131.

The unit pixel 100 provides a single pixel including the first, second, and third light emitting devices 10a, 10b, and 10c. The first, second, and third light emitting devices 10a, 10b, and 10c emit light of different colors, and the first, second, and third light emitting devices 10a, 10b, and 10c correspond to sub-pixels, respectively.

The transparent substrate 121 is a light transmissive substrate, such as PET, glass substrate, quartz, sapphire substrate, or the like. The transparent substrate 121 is disposed on a light emitting surface of the display apparatus 10000 of FIG. 1, and light emitted from the light emitting devices 10a, 10b, and 10c is emitted to the outside through the transparent substrate 121. The transparent substrate 121 may include a concave-convex PR on the light emitting surface. In this manner, light emission efficiency may be improved through the concave-convex PR, and more uniform light may be emitted due to the concave-convex PR. The transparent substrate 121 may also include an antireflection coating, or may include an antiglare layer or may be antiglare treated. The transparent substrate 121 may have a thickness of, for example, about 50 μm to about 500 μm.

Since the transparent substrate 121 is disposed on the light emitting surface, the transparent substrate 121 does not include a circuit. However, the inventive concepts are not limited thereto, and, in some exemplary embodiments, the transparent substrate 121 may include a circuit. Although a single unit pixel 100 is exemplarily illustrated as being formed on a single transparent substrate 121, a plurality of unit pixels 100 may be formed on the single transparent substrate 121.

The light blocking layer 123 may include an absorbing material which absorbs light, such as carbon black. The light absorbing material may prevent light generated in the light emitting devices 10a, 10b, and 10c from leaking from a region between the transparent substrate 121 and the light emitting devices 10a, 10b, and 10c toward a side surface thereof, and may improve contrast of the display apparatus.

The light blocking layer 123 may have a window 123a through which light progresses, so that light generated in the light emitting devices 10a, 10b, and 10c is incident on the transparent substrate 121. A width of the window 123a may be smaller than that of the light emitting device, but the inventive concepts are not limited thereto. In some exemplary embodiments, the width of the window 123a may be greater than or equal to the width of the light emitting device.

The window 123a of the light blocking layer 123 defines an arrangement location of the light emitting devices 10a, 10b, and 10c. As such, separate arrangement markers for defining arrangement locations of the light emitting devices 10a, 10b, and 10c may be obviated. However, the inventive concepts are not limited thereto, and, in some exemplary embodiments, the arrangement markers may be disposed on the transparent substrate 121, or on the light blocking layer 123 or the adhesive layer 125 to provide locations to arrange the light emitting devices 10a, 10b, and 10c.

The adhesive layer 125 is attached onto the transparent substrate 121. The adhesive layer 125 may cover the light blocking layer 123. The adhesive layer 125 may be attached to an entire surface of the transparent substrate 121, but the inventive concepts are not limited thereto, and, in some exemplary embodiments, the adhesive layer 125 may be attached to a portion of the transparent substrate 121 to expose a region near an edge of the transparent substrate 121. The adhesive layer 125 is used to attach the light emitting devices 10a, 10b, and 10c to the transparent substrate 121. The adhesive layer 125 may fill the window 123a formed in the light blocking layer 123.

The adhesive layer 125 may be formed of a light transmissive layer, and transmits light emitted from the light emitting devices 10a, 10b, and 10c. The adhesive layer 125 may include a diffuser, such as $SiO_2$, $TiO_2$, ZnO, or the like to diffuse light. The light diffusing material prevents the light emitting devices 10a, 10b, and 10c from being observed from the light emitting surface.

The first, second, and third light emitting devices 10a, 10b, and 10c are disposed on the transparent substrate 121. The first, second, and third light emitting devices 10a, 10b, and 10c may be attached to the transparent substrate 121 by the adhesive layer 125. The first, second, and third light emitting devices 10a, 10b, and 10c may be disposed to correspond to the windows 123a of the light blocking layer 123. In some exemplary embodiments, when the unit pixel does not include the light blocking layer 123, the arrangement markers may be added to provide the arrangement locations of the light emitting devices 10a, 10b, and 10c.

The first, second, and third light emitting devices 10a, 10b, and 10c may be, for example, red light emitting devices, green light emitting devices, and blue light emitting devices, respectively. Since the configurations of each of the first, second, and third light emitting devices 10a, 10b, and 10c are the same as those described with reference to FIGS. 2A, 2B, 3A, and 3B, repeated descriptions thereof will be omitted.

The first, second, and third light emitting devices 10a, 10b, and 10c may be linearly arranged as shown in FIG. 4A. In particular, when the transparent substrate 121 is a sapphire substrate, the sapphire substrate may include clean-cut surfaces (e.g., m-plane) and non clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut clean along the crystal plane, and the remaining two cutting planes (e.g., a-plane) disposed in a direction perpendicular to the cutting planes may not cut clean. In this case, the light emitting devices 10a, 10b, and 10c may be linearly arranged along the clean-cut surfaces of the sapphire substrate 121. For example, in FIG. 4A, the clean-cut surfaces (e.g., m-plane) may be disposed up and down sides, and the remaining two cut surfaces (e.g., a-plane) may be disposed left and right sides. On the display apparatus 10000 shown in FIG. 1, the clean-cut surfaces are arranged on the left and right sides from a viewer who observes the display.

The first, second, and third light emitting devices 10a, 10b, and 10c may be those described above with reference to FIGS. 2A, 2B, 3A, and 3B, but the inventive concepts are not limited thereto, and various light emitting devices having a lateral or flip chip structure may be used in other exemplary embodiments.

The step adjustment layer 127 covers the first, second, and third light emitting devices 10a, 10b, and 10c. The step adjustment layer 127 has openings 127a exposing the first and second electrode pads 31 and 33 of the light emitting devices 10a, 10b, and 10c. The step adjustment layer 127 may substantially planarize a surface on which the connection layers 129a, 129b, 129c, and 129d and the bumps 133a, 133b, 133c, and 133d are to be formed. In particular, the step adjustment layer 127 may allow the bumps 133a, 133b, 133c, and 133d to be formed at substantially the same elevation. The step adjustment layer 127 may be formed of, for example, photosensitive polyimide.

The step adjustment layer 127 may have a concave-convex pattern along an edge thereof as shown in FIG. 4A. A shape of the concave-convex pattern may vary. A depth and a width of a concave portion formed to have the concave-convex pattern or a depth and a width of a convex portion therein may be adjusted. The concave-convex pattern formed on the step adjustment layer 127 may reduce compressive stress applied to the adhesive layer 125 by the step adjustment layer 127, and thus, may prevent peelings of the step adjustment layer 127 and the adhesive layer 125.

The step adjustment layer 127 may be formed to partially expose an edge of the adhesive layer 125 as illustrated in FIG. 4A, but the inventive concepts are not limited thereto. In some exemplary embodiments, the step adjustment layer 127 may be disposed in a region surrounded by edges of the adhesive layer 125.

The connection layers 129a, 129b, 129c, and 129d are formed on the step adjustment layer 127. The connection layers 129a, 129b, 129c, and 129d may be connected to the first and second electrode pads 31 and 33 of the first, second, and third light emitting devices 10a, 10b, and 10c through the openings 127a of the step adjustment layer 127.

For example, the connection layer 129a may be electrically connected to a first conductivity type semiconductor layer of the first light emitting device 10a, the connection layer 129b may be electrically connected to a first conductivity of the second light emitting device 10b, the connection layer 129c may be electrically connected to a first conductivity type semiconductor layer of the third light emitting device 10c, and the connection layer 129d may be commonly electrically connected to second conductivity type semiconductor layers of the first, second, and third light emitting devices 10a, 10b, and 10c. The connection layers 129a, 129b, 129c, and 129d may be formed together on the step adjustment layer 127, and may include, for example, Au.

The bumps 133a, 133b, 133c, and 133d are formed on the connection layers 129a, 129b, 129c, and 129d, respectively. For example, the first bump 133a may be electrically connected to the first conductivity type semiconductor layer of the first light emitting device 10a through the connection layer 129a, the second bump 133b may be electrically connected to the first conductivity type semiconductor layer of the second light emitting device 10b through the connection layer 129b, and the third bump 133c may be electrically connected to the first conductivity type semiconductor layer of the third light emitting device 10c through the connection layer 129c. The fourth bump 133d may be commonly electrically connected to the second conductivity type semiconductor layers of the first, second, and third light emitting devices 10a, 10b, and 10c through the connection layer 129d. The bumps 133a, 133b, 133c, and 133d may be formed of, for example, metal and/or a metal alloy, such as AuSn, SnAg, Sn, CuSn, CuN, CuAg, Sb, Ni, Zn, Mo, Co, solder, or the like.

The protection layer 131 may cover side surfaces of the bumps 133a, 133b, 133c, and 133d, and may cover the step adjustment layer 127. In addition, the protection layer 131 may cover the adhesive layer 125 exposed around the step adjustment layer 127. The protection layer 131 may be formed of, for example, a photosensitive solder resist (PSR). Accordingly, the protection layer 131 may be patterned first through photolithography and development processes, and then the bumps 133a, 133b, 133c, and 133d may be formed. To this end, the protection layer 131 may be formed to have openings exposing the connection layers 129a, 129b, 129c, and 129d, and the bumps 133a, 133b, 133c, and 133d may be formed in the openings of the protection layer 131. In some exemplary embodiments, the bumps 133a, 133b, 133c, and 133d may be omitted.

The protection layer 131 may be formed of a light absorbing material such as a white reflective material or a black epoxy to prevent light leakage.

Figure 5A:
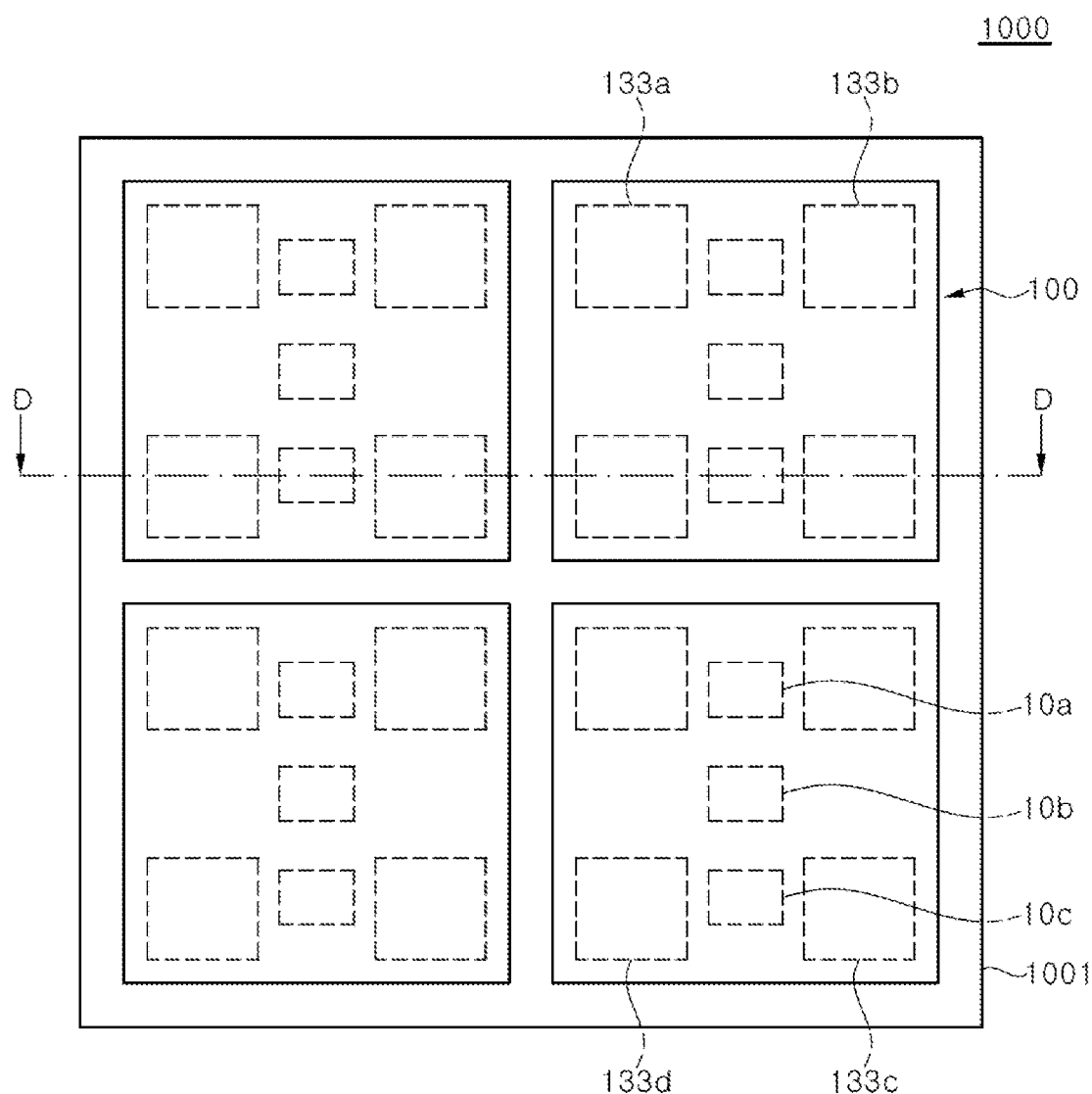
FIG. 5A is a schematic plan view illustrating a pixel module according to an exemplary embodiment.
Figure 5B:
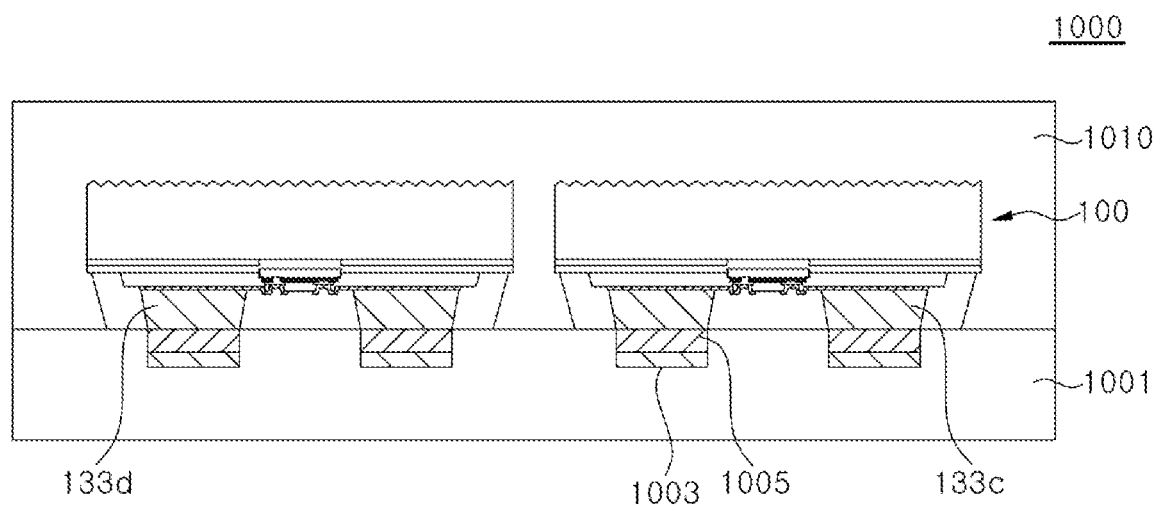
FIG. 5B is a schematic cross-sectional view taken along line D-D of FIG. 5A.
Figure 5C:
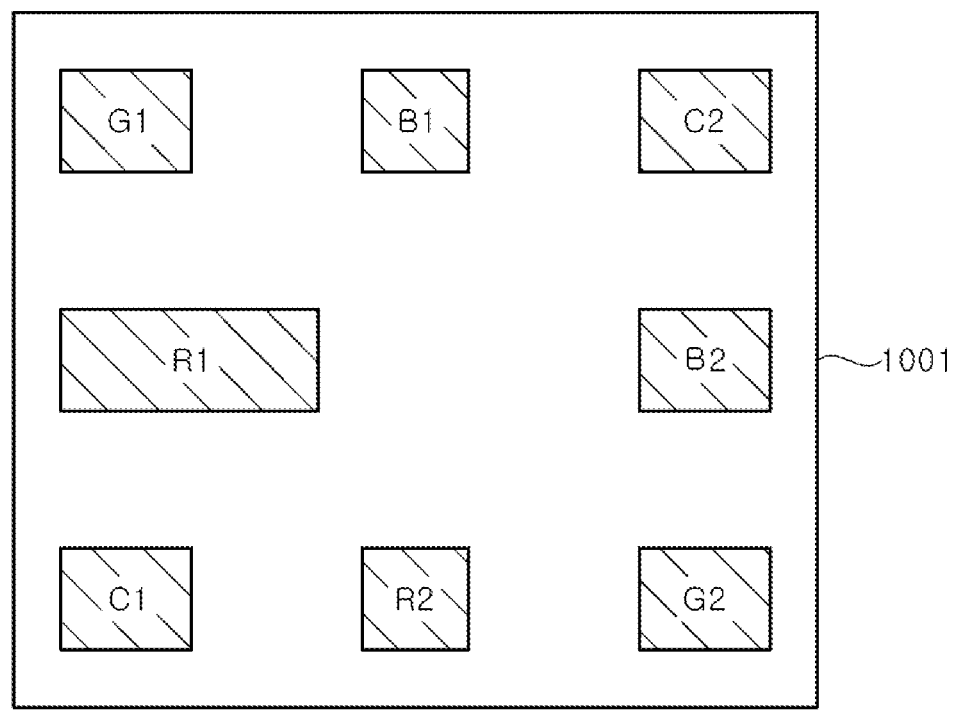
FIG. 5C is a schematic rear view of a pixel module according to an exemplary embodiment.
Figure 5D:
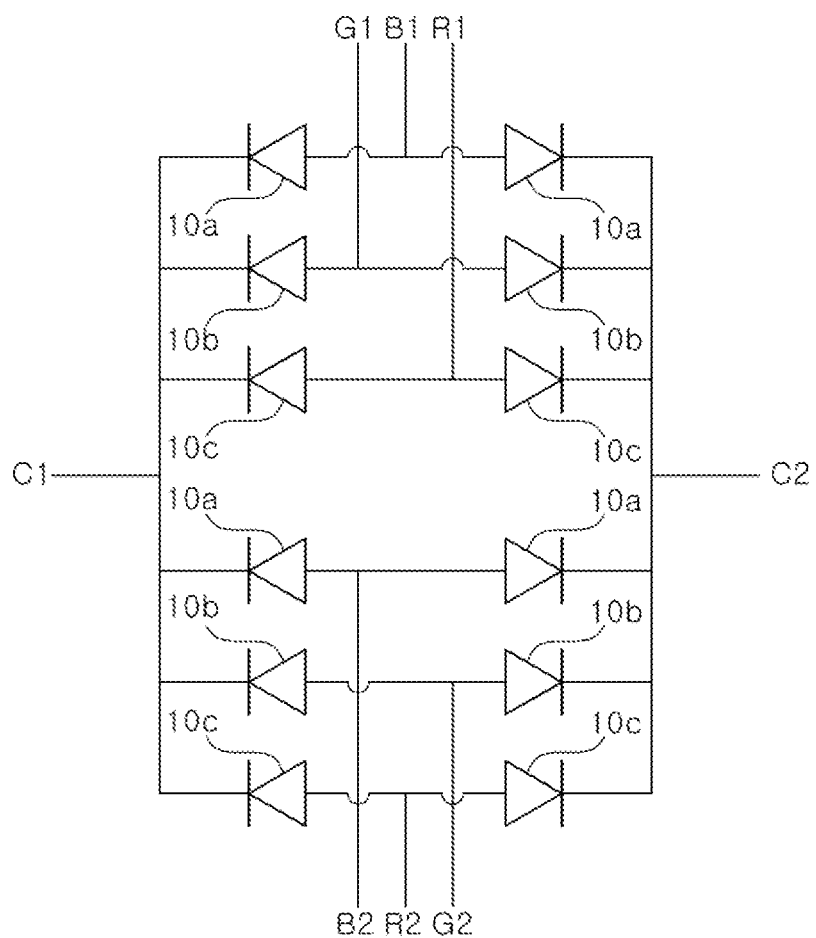
FIG. 5D is a schematic circuit diagram of a pixel module according to an exemplary embodiment.

FIG. 5A is a schematic plan view of a pixel module 1000 according to an exemplary embodiment, FIG. 5B is a schematic cross-sectional view taken along line D-D of FIG. 5A, FIG. 5C is a rear view of the pixel module 1000, and FIG. 5D is an exemplary circuit diagram of the pixel module 1000.

Referring to FIGS. 5A and 5B, the pixel module 1000 includes a circuit board 1001 and unit pixels 100 arranged on the circuit board 1001. The pixel module 1000 may further include a cover layer 1010 covering the unit pixels 100.

The circuit board 1001 may have a circuit for electrically connecting a panel substrate 2100 (see FIG. 1) and the light emitting devices 10a, 10b, and 10c. The circuit in the circuit board 1001 may have a multilayer structure. The circuit board 1001 may also include a passive circuit for driving the light emitting devices 10a, 10b, and 10c in a passive matrix driving manner or an active circuit for driving the light emitting devices 10a, 10b, and 10c in an active matrix driving manner. The circuit board 1001 may include pads 1003 exposed on a surface thereof. The pads 1003 may be arranged to correspond to the bumps 133a, 133b, 133c, and 133d in the unit pixels 100 to be mounted thereon.

Since the configuration of the unit pixels 100 is the same as that described with reference to FIGS. 4A and 4B, repeated descriptions thereof will be omitted to avoid redundancy. The unit pixels 100 may be arranged on the circuit board 1001. The unit pixels 100 may be arranged in a 2×2 matrix as shown in FIG. 5A, but the inventive concepts are not limited thereto. In some exemplary embodiments, the unit pixels 100 may be arranged in various matrices, such as 2×3, 3×3, 4×4, 5×5, or the like.

The unit pixels 100 are bonded to the circuit board 1001 by a bonding material 1005. For example, the bonding material 1005 may bond the bumps 133a, 133b, 133c, and 133d to the pads 1003. When the bumps 133a, 133b, 133c, and 133d are formed of solder, the bonding material 1005 may be omitted.

The cover layer 1010 covers a plurality of unit pixels 100. The cover layer 1010 may improve contrast of the display apparatus by preventing optical interference between the unit pixels 100.

The cover layer 1010 may be formed of, for example, a dry-film type solder resist (DFSR), a photo-imageable solder resist (PSR), a black material (BM), an epoxy molding compound (EMC), or the like. The cover layer 1010 may be formed using, for example, a technique such as lamination, spin coating, slit coating, printing, or the like.

A display apparatus 10000 may be provided by mounting the pixel modules 1000 on the panel substrate 2100 of FIG. 1 as shown in FIGS. 5A and 5B. The circuit board 1001 has bottom pads connected to the pads 1003. The bottom pads may be arranged in a one-to-one correspondence with the pads 1003, but the number of the bottom pads may be reduced through a common connection. Hereinafter, the pixel module 1000 having the unit pixels 100 arranged in a 2×2 matrix will be described with reference to FIGS. 5C and 5D as an example.

FIG. 5C illustrates a rear view of the pixel module 1000, which shows bottom pads C1, C2, R1, R2, G1, G2, B1, and B2 of the circuit board 1001. Since the unit pixels 100 are arranged in a 2×2 matrix, a total of four unit pixels 100 are arranged on the circuit board 1001. According to an exemplary embodiment, three light emitting devices 10a, 10b, and 10c and four bumps 133a, 133b, 133c, and 133d are disposed on each unit pixel 100 as described above. Accordingly, sixteen pads 1003 corresponding to the bumps of the four unit pixels 100 would generally be provided on the circuit board 1001. However, according to the illustrated exemplary embodiment, only eight bottom pads may be disposed on the circuit board 1001, which may be connected to the panel substrate 2100 to individually drive each of the light emitting devices 10a, 10b, and 10c.

FIG. 5D illustrates a schematic circuit diagram in which each of the light emitting devices 10a, 10b, and 10c is connected to the bottom pads C1, C2, R1, R2, G2, G2, B1, and B2 according to an exemplary embodiment.

Referring to FIG. 5D, the bottom pad C1 is commonly connected to cathodes of the light emitting devices 10a, 10b, and 10c disposed in the left column, and the bottom pad C2 is commonly connected to cathodes of the light emitting devices 10a, 10b, and 10c disposed in the right column.

In the unit pixels 100 arranged in the upper row, the bottom pad B1 may be connected to anodes of the first light emitting devices 10a, the bottom pad G1 may be connected to anodes of the second light emitting devices 10b, and the bottom pad R1 may be connected to anodes of the third light emitting devices 10c.

In the unit pixels 100 arranged in the lower row, the bottom pad B2 may be connected to the anodes of the first light emitting devices 10a, the bottom pad G2 may be connected to the anodes of the second light emitting devices 10b, and the bottom pad R2 may be connected to the anodes of the third light emitting devices 10c.

The bottom pads R1, G1, B1, R2, G2, and B2 represent pads connected to red, green, and blue light emitting devices, respectively. However, the order of arrangement of the red, green, and blue light emitting devices may be changed, and, accordingly, locations to which the bottom pads R1, G1, B1, R2, G2, and B2 are connected may also be changed. For example, the circuit diagram of FIG. 5D exemplarily shows the arrangement of the bottom pads when the first light emitting devices 10a are blue light emitting devices, the second light emitting devices 10b are green light emitting devices, and the third light emitting devices 10c are red light emitting devices. Alternatively, the first light emitting devices 10a may be the red light emitting devices, and the third light emitting devices 10c may be the blue light emitting devices, and, in this case, the locations of the bottom pads R1 and R2 and the bottom pads B1 and B2 may be interchanged.

According to the illustrated exemplary embodiment, since the bottom pads C1 and C2 are commonly connected to the cathodes of the light emitting devices in each column, and each of the bottom pads R1, G1, B1, R2, B2, and G2 are connected to the anodes of the two light emitting devices, each of the light emitting devices 10a, 10b, and 10c may be driven independently while reducing the total number of the bottom pads.

Figure 5E:
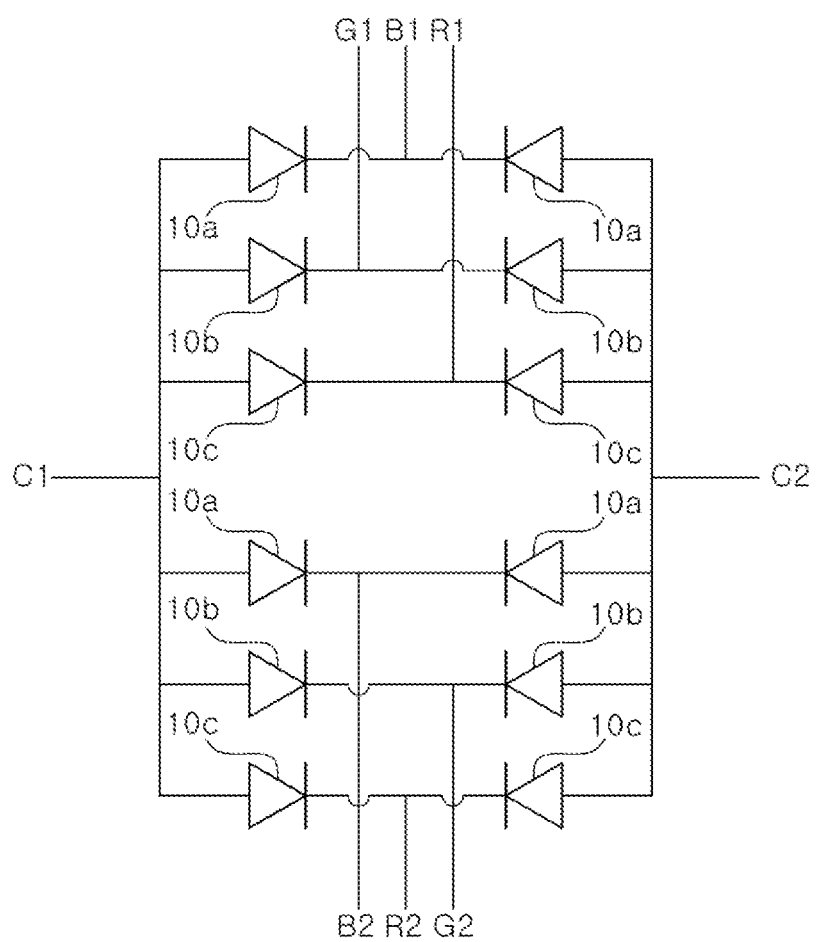
FIG. 5E is a schematic circuit diagram of a pixel module according to another exemplary embodiment.

Although FIG. 5D exemplarily illustrates that the bottom pads C1 and C2 are connected to the cathodes of the light emitting devices and the bottom pads R1, G1, B1, R2, B2 and G2 are connected to the anodes of the light emitting device, the inventive concepts are not limited thereto. In another exemplary embodiment, the bottom pads C1 and C2 may be connected to the anodes of the light emitting devices, and the bottom pads R1, G1, B1, R2, B2 and G2 may be connected to the cathodes of the light emitting device, as shown in FIG. 5E.

While the pixel module 1000 above is described as including the unit pixels 100 arranged in a 2×2 matrix, the number of the bottom pads may be reduced using a common connection circuit even when the unit pixels 100 are arranged in another matrix, such as 3×3, 5×5, or the like.

The light emitting devices 10a, 10b, and 10c in the pixel module 1000 may be individually driven by a driving IC disposed on the panel substrate 2100, and images may be implemented by a plurality of pixel modules 1000.

Figure 6A:
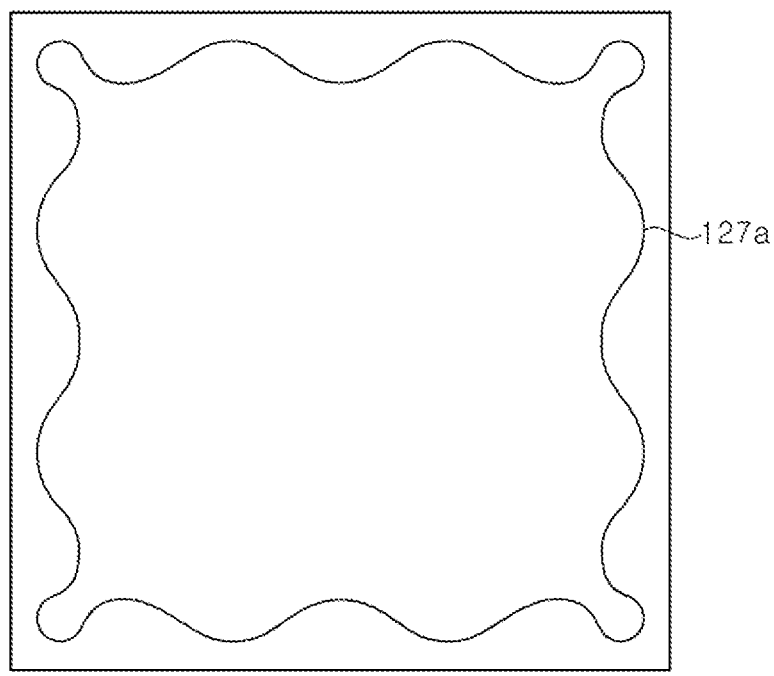
FIG. 6A, FIG. 6B, and FIG. 6C are schematic plan views of a unit pixel according to exemplary embodiments.
Figure 6B:
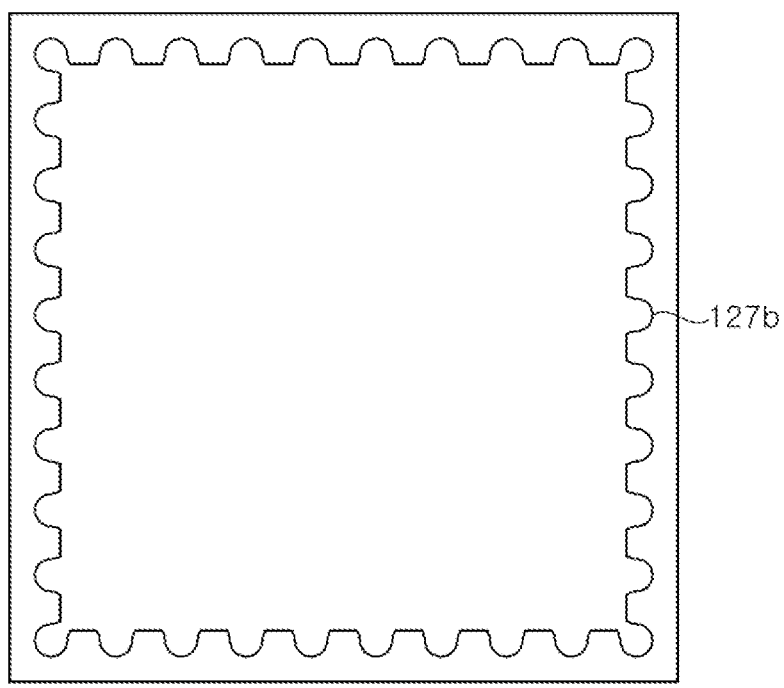
Figure 6C:
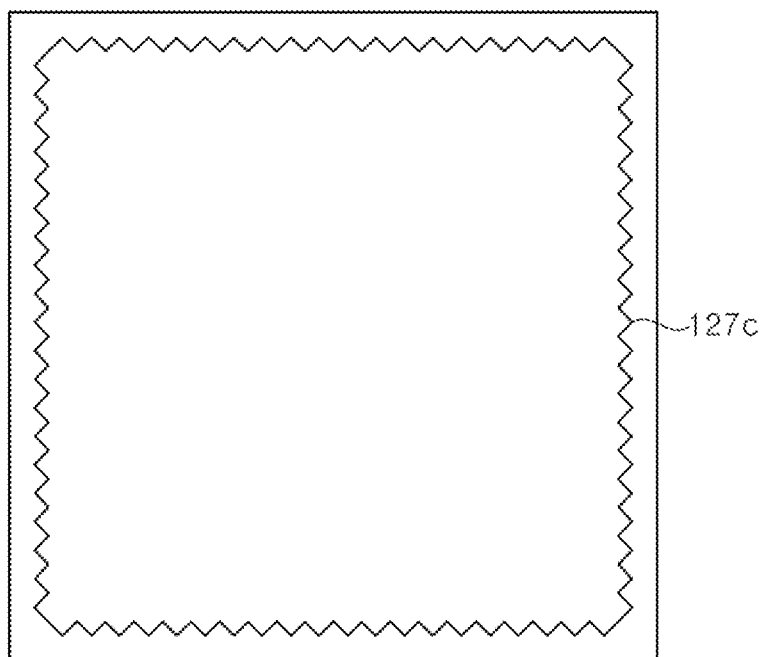

FIGS. 6A, 6B, and 6C are schematic plan views of a unit pixel according to exemplary embodiments. In particular, FIGS. 6A, 6B, and 6C illustrate various modified concave-convex patterns of a step adjustment layer 127.

Referring to FIG. 6A, the step adjustment layer 127a according to an exemplary embodiment may have a relatively wider concave-convex pattern than those described above. In particular, relatively narrow and slender portions may be disposed at corners of the step adjustment layer 127a, thereby suppressing concentration of stress on the corners of the step adjustment layer 127a.

In addition, a concave portion and a convex portion of a step adjustment layer 127a may have substantially an arc shape having a constant radius, and radiuses of the concave portion and the convex portion may be substantially the same or different from each other.

A bottom of a concave portion of a step adjustment layer 127b may be substantially flat as shown in FIG. 6B. A concave-convex pattern of a step adjustment layer 127c may have a serrated shape as shown in FIG. 6C.

As described above, the concave-convex pattern of the step adjustment layer 127 may be variously modified to prevent stress from concentrating on the corners while the step adjustment layer 127 contracts.

According to an exemplary embodiment, an insulation region 37 may be formed using ion implantation along an edge of the light emitting device 10a. In this manner, non-radiative surface recombination may be prevented from occurring on a side surface of the light emitting device 10a. As such, luminous efficiency of the light emitting device 10a emitting red light may be improved.

Figure 7A:
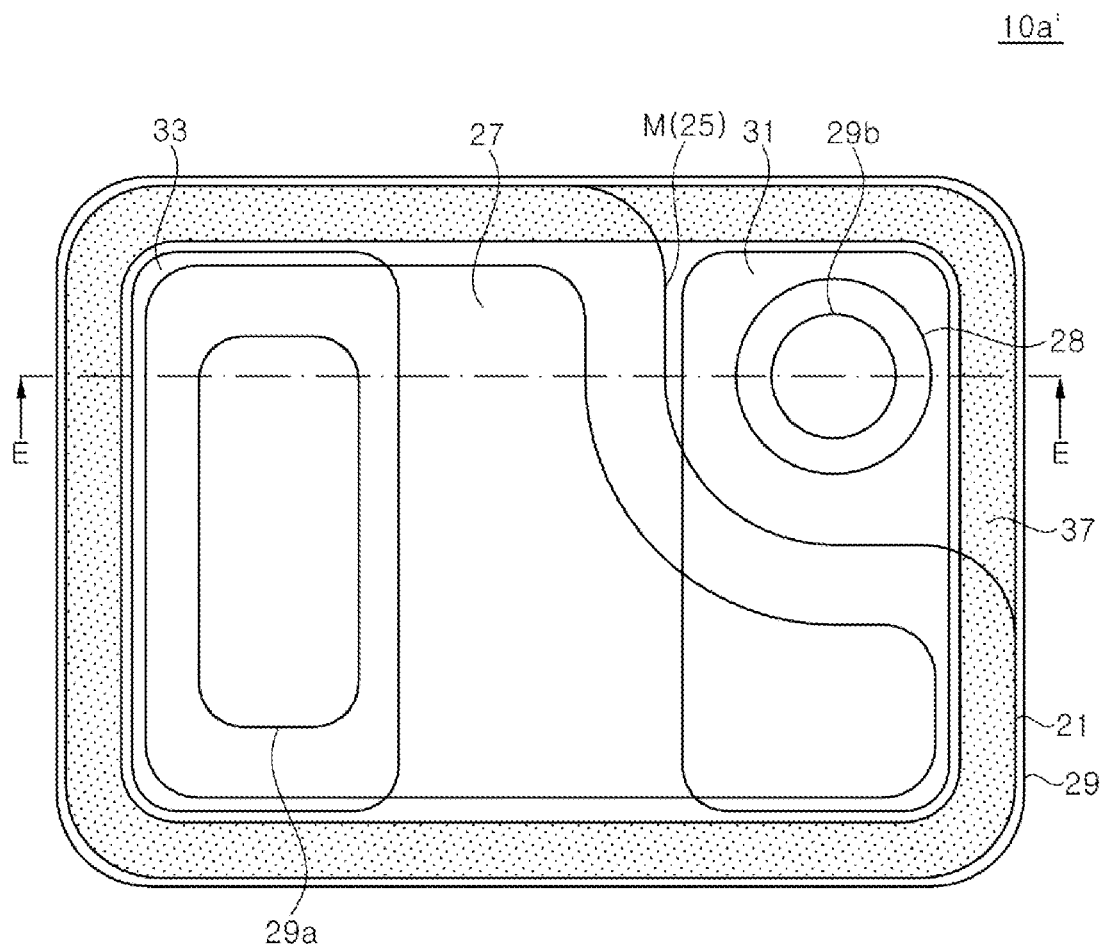
FIG. 7A is a schematic plan view illustrating a light emitting device according to an exemplary embodiment.
Figure 7B:
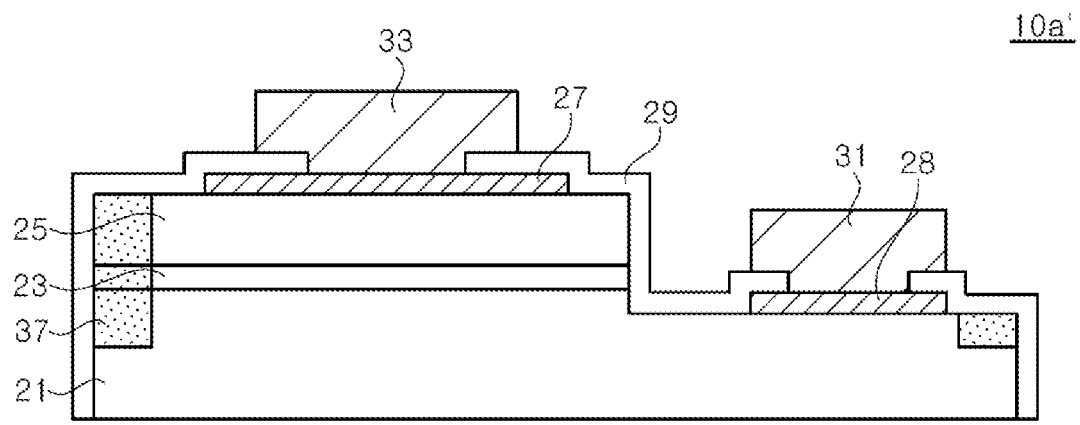
FIG. 7B is a schematic cross-sectional view taken along line E-E of FIG. 7A.

FIG. 7A is a schematic plan view of a light emitting device according to an exemplary embodiment, and FIG. 7B is a schematic cross-sectional view taken along line E-E of FIG. 7A.

Referring to FIGS. 7A and 7B, the light emitting device 10a' according to an exemplary embodiment is substantially similar to the light emitting device 10a described with reference to FIGS. 2A and 2B, except a mesa M is formed rather than the through hole 25a.

The mesa M is formed by removing the second conductivity type semiconductor layer 25 and the active layer 23 by etching, and the first conductivity type semiconductor layer 21 is exposed around the mesa M. In the illustrated exemplary embodiment, the mesa M may have a side surface that is flush with the first conductivity type semiconductor layer 21 except for a region for exposing the first conductivity type semiconductor layer 21.

An insulation region 37 may be formed along an edge of the light emitting device 10a'. As shown in FIG. 7A, the insulation region 37 may be formed in substantially a ring shape along the edge of the light emitting device 10a', but the inventive concepts are not limited thereto. The insulation region 37 may be formed by ion implantation to prevent non-radiative recombination from occurring on a side surface of the mesa M. The insulation region 37 may be formed over the second conductivity type semiconductor layer 25, the active layer 23, and the first conductivity type semiconductor layer 21. As described above, the insulation region 37 may be formed over an entire thickness of the first conductivity type semiconductor layer 21, or may be formed to a partial thickness of the first conductivity type semiconductor layer 21 as shown in the drawing.

In some exemplary embodiments, the insulation region 37 may also be formed on a portion of the side surface of the mesa M adjacent to an electrode 28. Since the insulation region 37 is formed along an edge of the mesa M, non-radiative surface recombination may be prevented from occurring on an entire side surface of the mesa M. In this case, the insulation region 37 may be formed to a partial thickness of the first conductivity type semiconductor layer 21 to provide a current path.

The electrode 28 is formed on the exposed first conductivity type semiconductor layer 21. The electrode 28 is in ohmic contact with the first conductivity type semiconductor layer 21. The electrode 28 may include, for example, AuGe or AuTe.

An insulation layer 29 may cover electrodes 27 and 28, and cover side surfaces of the first conductivity type semiconductor layer 21, the active layer 23, and the second conductivity type semiconductor layer 25. In addition, the insulation layer 29 may cover the second conductivity type semiconductor layer 25 exposed around the electrode 27, and cover the first conductivity type semiconductor layer 21 exposed around the electrode 28. Furthermore, the insulation layer 29 may cover the side surface of the mesa M adjacent to the electrode 28. As described above, the insulation layer 29 may function as a surface protection layer, and the side surface of the mesa M may be surface-treated before the insulation layer 29 is formed.

The insulation layer 29 may have openings exposing the electrodes 27 and 28, and an electrode pad 31 and an electrode pad 33 may be electrically connected to the electrode 28 and the electrode 27 through the openings, respectively.

Figures 8A, 8B:
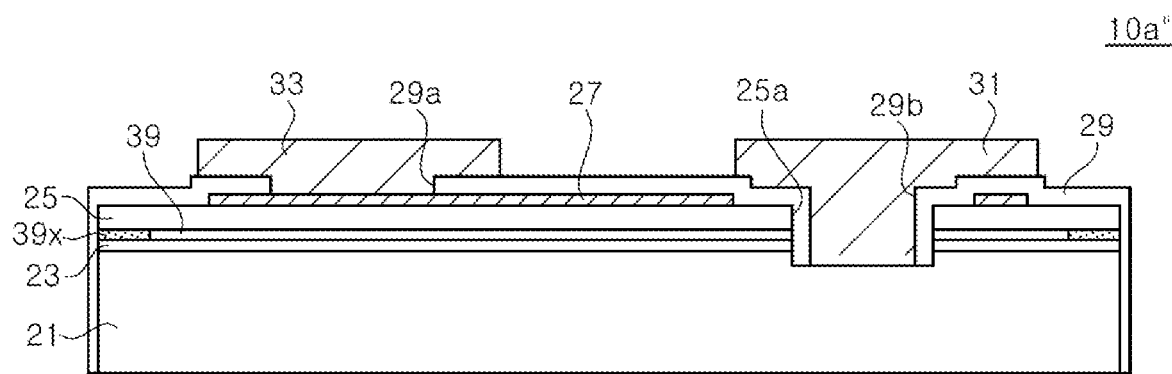
FIG. 8A is a schematic cross-sectional view of a light emitting device according to an exemplary embodiment.
FIG. 8B is a schematic cross-sectional view illustrating a light emitting device according to an exemplary embodiment.

FIG. 8A is a schematic cross-sectional view of a light emitting device 10a" according to an exemplary embodiment.

Referring to FIG. 8A, the light emitting device according to the illustrated exemplary embodiment is substantially similar to the light emitting device 10a described with reference to FIGS. 2A and 2B, except an oxidation region 39x is formed to prevent non-radiative surface recombination rather than the insulation region 37.

More particularly, in the illustrated exemplary embodiment, an oxidation region forming layer 39 is disposed between the active layer 23 and the second conductivity type semiconductor layer 25. However, the inventive concepts are not limited thereto, and the oxidation region forming layer 39 may be disposed between the active layer 23 and the first conductivity type semiconductor layer 21 in other exemplary embodiments. The oxidation region forming layer 39 is exposed to a side surface of the light emitting structure, and the exposed oxidation region forming layer 39 may be oxidized to form the oxidation region 39x. The oxidation region 39x may be formed along an edge of the light emitting structure. The oxidation region 39x prevents a carrier from moving along the side surface of the light emitting structure to prevent non-radiative surface recombination. Moreover, the oxidation region 39x may cause recombination of electrons and holes to be concentrated in a light emitting region located in an inner region of the active layer 23.

The oxidation region forming layer 39 may include a higher Al content than semiconductor layers surrounding the oxidation region forming layer 39. As such, an exposed side surface may be oxidized by the oxidation process.

FIG. 8B is a schematic cross-sectional view of a light emitting device 10a''' according to an exemplary embodiment.

Referring to FIG. 8B, the light emitting device 10a''' according to the illustrated exemplary embodiment is substantially similar to the light emitting device 10a' described with reference to FIGS. 7A and 7B, except an oxidation region 39x is formed to prevent non-radiative surface recombination rather than the insulation region.

As described with reference to FIG. 8A, an oxidation region forming layer 39 is formed to form the oxidation region 39x, and the oxidation region 39x is formed by oxidizing the oxidation region forming layer 39 exposed to a side surface of a light emitting structure or a mesa M.

In the illustrated exemplary embodiment, the oxidation region 39x is exemplarily shown as being formed along a periphery of the mesa M, but in some exemplary embodiments, the oxidation region 39x may be omitted on a side surface of the mesa M adjacent to an electrode 28.

Figure 9A:
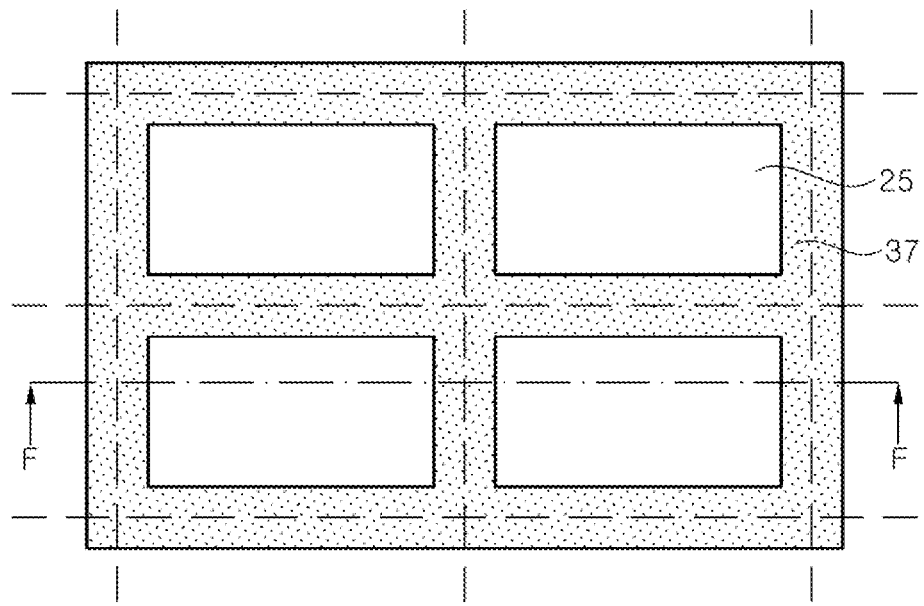
FIGS. 9A, 9B, and 9C are schematic plan views and cross-sectional views illustrating a method of manufacturing a light emitting device according to an exemplary embodiment.
Figure 9B:
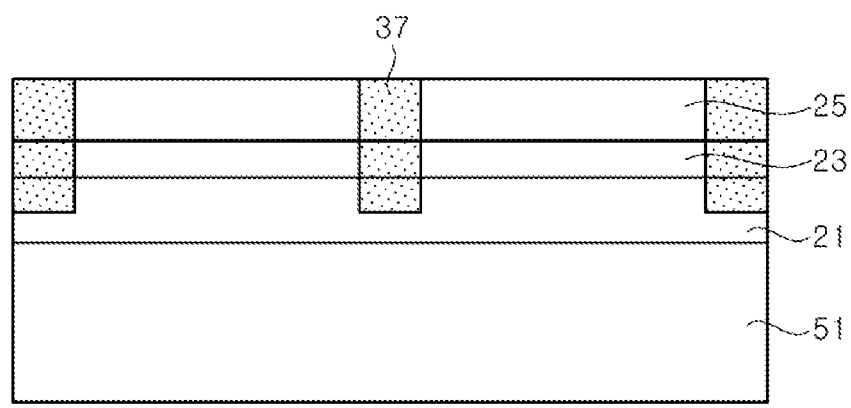
Figure 9C:
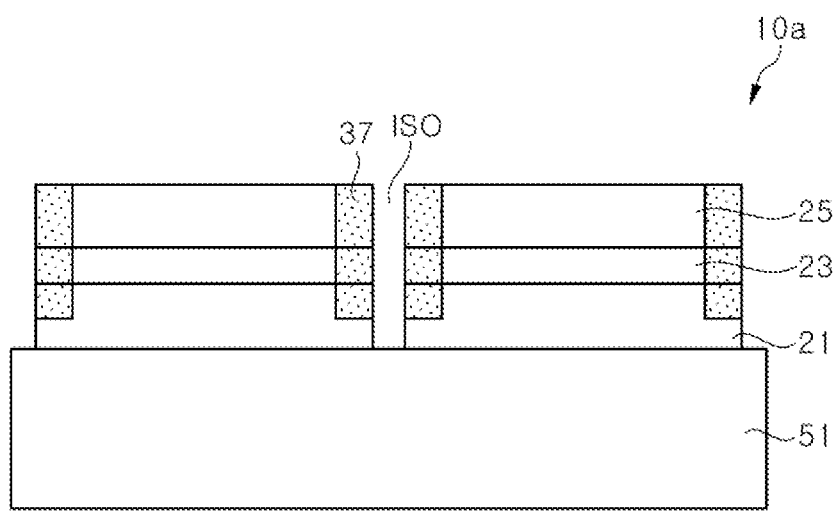

FIGS. 9A, 9B, and 9C are schematic plan views and cross-sectional views illustrating a method of manufacturing a light emitting device 10a according to an exemplary embodiment.

Referring to FIGS. 9A and 9B, a first conductivity type semiconductor layer 21, an active layer 23, and a second conductivity type semiconductor layer 25 are grown on a substrate 51. The substrate 51 may be a GaAs substrate or a Si substrate, and the first conductivity type semiconductor layer 21, the active layer 23, and the second conductivity type semiconductor layer 25 are semiconductor layers that may emit red light.

After the semiconductor layers 21, 23, and 25 are grown, ions are implanted into the semiconductor layers to form an insulation region 37. Ions may be implanted into the semiconductor layers through an ion implantation process.

Ions may be implanted along an isolation region for separating light emitting devices. In FIG. 9A, a dotted line indicates a location of a device isolation region in which the light emitting devices 10a are to be individually separated.

As shown in FIG. 9B, ions may be implanted to a partial thickness of the first conductivity type semiconductor layer 21. In some exemplary embodiments, ions may be implanted to the substrate 51 so that an insulation region 37 may be formed over an entire thickness of the first conductivity type semiconductor layer 21.

Referring to FIG. 9C, the light emitting devices 10a are separated from one another by separating the devices along the device isolation region. Before or after forming an isolation region ISO for singularizing the light emitting devices 10a, an electrode 27, an insulation layer 29, and electrode pads 31 and 33 may be formed.

The substrate 51 is removed from the light emitting devices 10a. For example, while the light emitting devices 10a are transferred to a unit pixel 100, the substrate 51 may be removed from the light emitting device 10a by mechanical polishing or chemical etching.

According to the illustrated exemplary embodiment, the insulation region 37 may be formed along a side surface of the light emitting device 10a, and thus, non-radiative surface recombination may be prevented by the insulation region 37, thereby improving luminous efficiency of the light emitting device 10a.

Figure 10A:
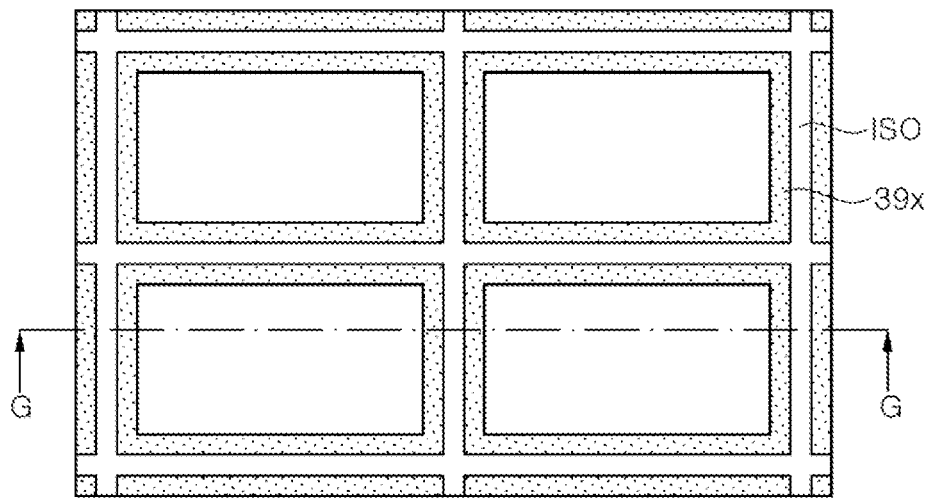
FIG. 10A and FIG. 10B are a schematic plan view and a cross-sectional view illustrating a method of manufacturing a light emitting device according to an exemplary embodiment, respectively.
Figure 10B:
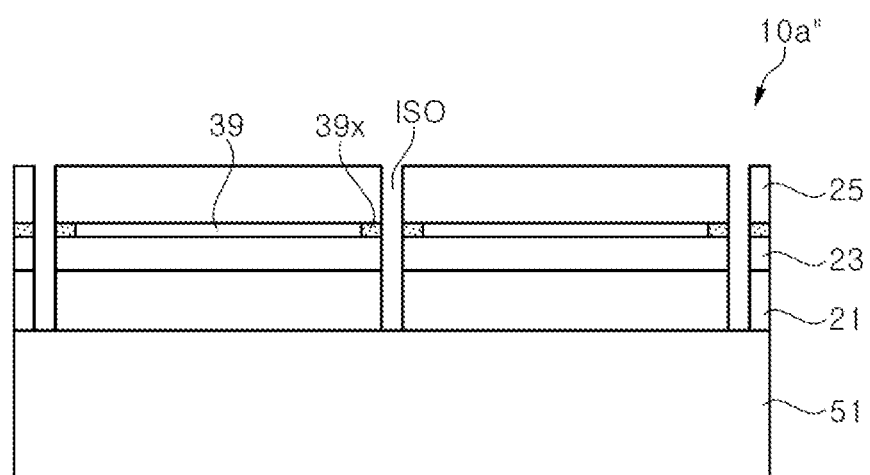

FIG. 10A and FIG. 10B are a schematic plan view and a cross-sectional view illustrating a method of manufacturing a light emitting device 10a" according to an exemplary embodiment, respectively.

Referring to FIGS. 10A and 10B, a first conductivity type semiconductor layer 21, an active layer 23, an oxidation region forming layer 39, and a second conductivity type semiconductor layer 25 are grown on a substrate 51. The substrate 51 may be a GaAs substrate or a Si substrate, and the first conductivity type semiconductor layer 21, the active layer 23, and the second conductivity type semiconductor layer 25 are semiconductor layers that may emit red light. The oxidation region forming layer 39 may be formed of a semiconductor layer having a high Al content.

After the semiconductor layers 21, 23, 25, and the oxidation region forming layer 39 are grown, a device isolation region ISO is formed. The device isolation region ISO defines a region of the light emitting device 10a". Further, a side surface of the oxidation region forming layer 39 is exposed by the device isolation region ISO.

Subsequently, an oxidation region 39x is formed by oxidizing a portion of the oxidation region forming layer 39. The oxidation region 39x may be formed along a periphery of the light emitting device 10a". The oxidation may be performed at a temperature of, for example, 400° C. or higher. The oxidation region forming layer 39 may control an Al composition ratio and an oxidation temperature, and thus, an oxidation rate may be about at least 10 times than the first and second conductivity type semiconductor layers 21 and 25.

The oxidation region 39x is formed in the oxidation region forming layer 39 exposed by the device isolation region ISO through the oxidation process. The oxidation region 39x proceeds to the inside of the oxidation region forming layer 39 through the oxidation region forming layer 39 exposed to the device isolation region ISO.

After the oxidation region 39x is formed, an electrode 27, an insulation layer 29, and electrode pads 31 and 33 may be formed, and the substrate 51 is removed from the light emitting device 10a″.

According to the illustrated embodiment, the oxidation region 39x may be formed along a side surface of the light emitting device 10a″, and thus, non-radiative surface recombination may be prevented by the oxidation region 39x, thereby improving luminous efficiency of the light emitting device 10a″.

In the above-described exemplary embodiments, the light emitting devices 10a, 10b, and 10c form sub-pixels, and these sub-pixels are combined to form the unit pixel 100 described with reference to FIGS. 4A and 4B. The unit pixel 100 may facilitate the mounting process of the light emitting devices 10a, 10b, and 10c on a display panel 2100.

According to an exemplary embodiment, instead of the unit pixel 100 on which the light emitting devices 10a, 10b, and 10c are individually mounted, a light emitting device in which a plurality of LEDs is stacked may be used as a unit pixel. As such, the unit pixel 100 described above has a structure in which the light emitting devices 10a, 10b, and 10c are arranged in the lateral direction, but a unit pixel described below has a structure in which the light emitting devices 10a, 10b, and 10c are stacked in the vertical direction. Hereinafter, a unit pixel in which a plurality of LEDs is stacked, that is, a light emitting device 100a, will be described in detail with reference to FIGS. 11, 12A, and 12B. In this case, the light emitting device 100a forms one unit pixel, and these light emitting devices 100a may be directly mounted on the display panel 2100, or these light emitting devices 100a may be mounted on the panel 2100 after being manufactured as a pixel module 1000.

Figure 11:
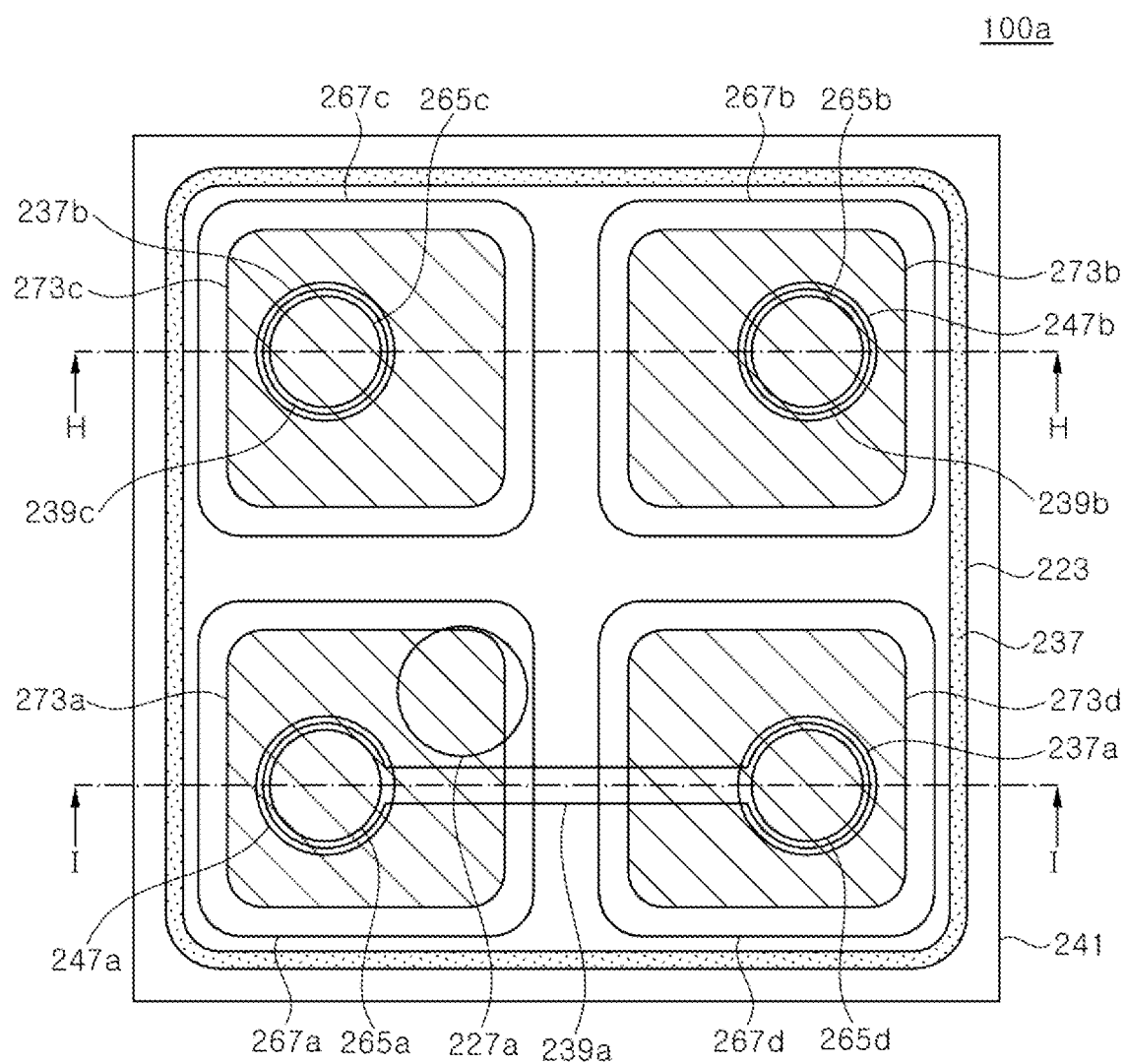
FIG. 11 is a schematic plan view of a light emitting device according to an exemplary embodiment.
Figure 12A:
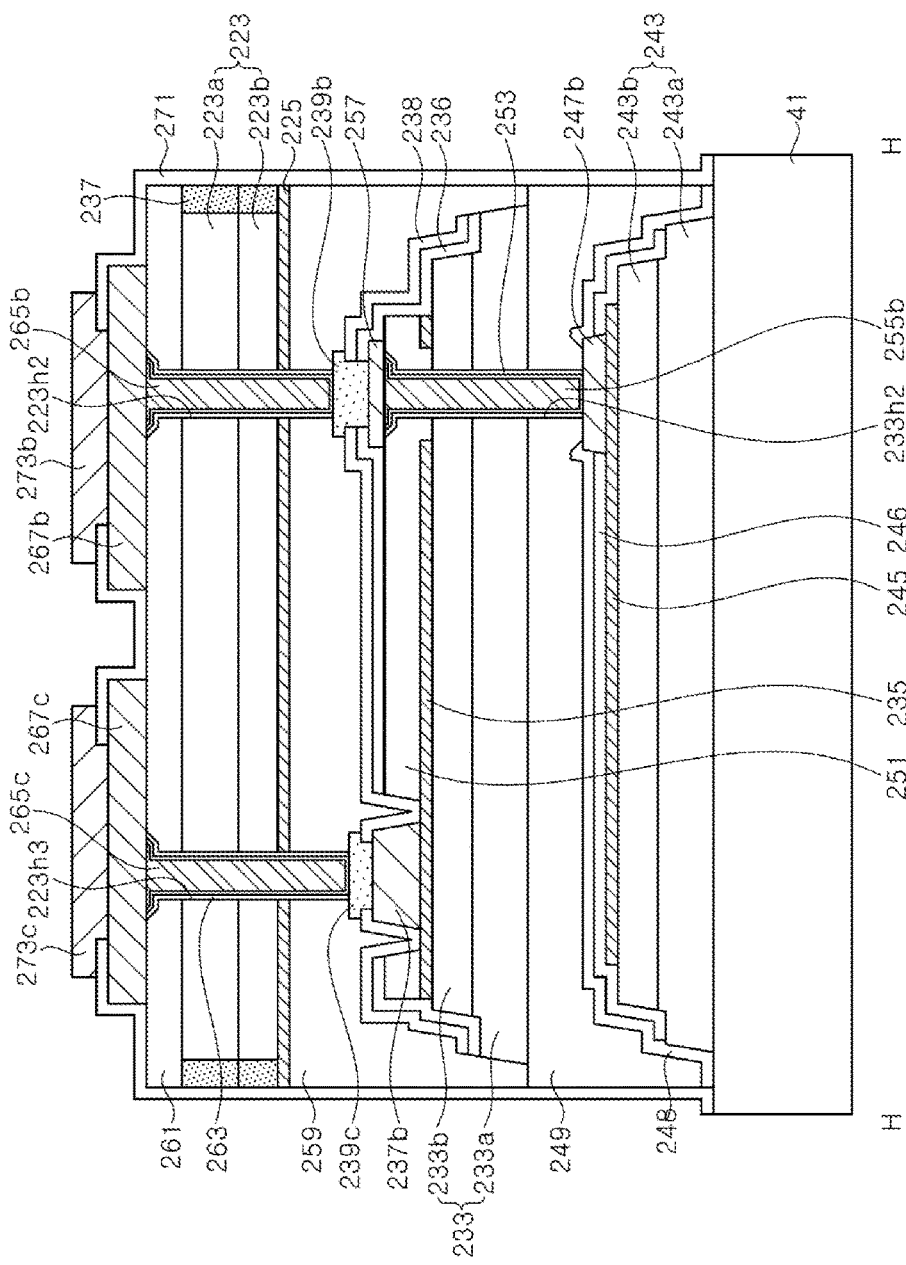
FIG. 12A and FIG. 12B are schematic cross-sectional views taken along line A-A' and B-B' of FIG. 11, respectively.
Figure 12B:
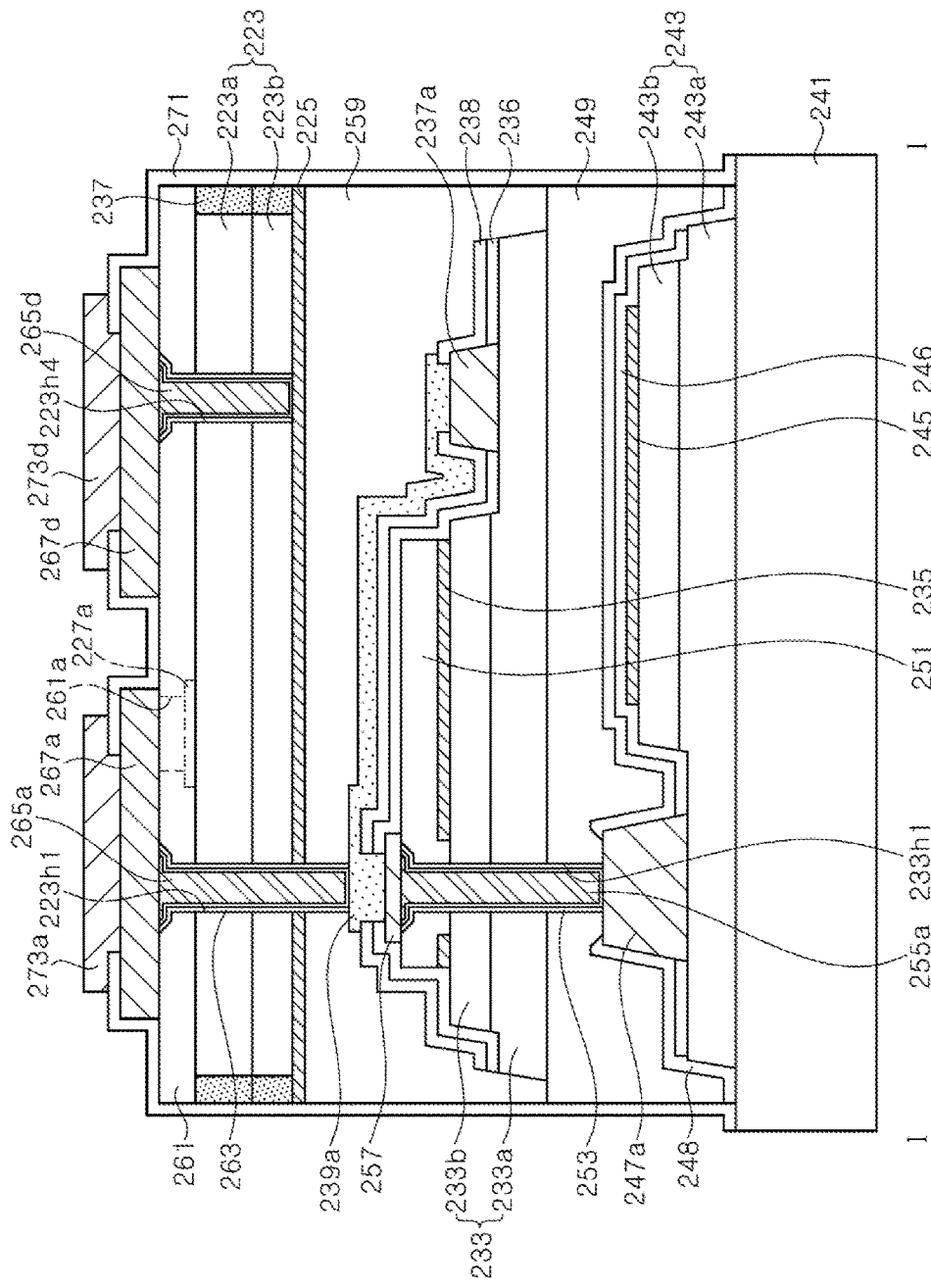

FIG. 11 is a schematic plan view of the light emitting device 100a according to an exemplary embodiment, and FIGS. 12A and 12B are schematic cross-sectional views taken along line H-H and I-I of the light emitting device 100a of FIG. 11, respectively, according to an exemplary embodiment.

Hereinafter, although bump pads 273a, 273b, 273c, and 273d are exemplarily illustrated and described as being disposed at an upper side in the drawings, when the light emitting device 100a is flip-bonded on a circuit board, the bump pads 273a, 273b, 273c, and 273d are disposed at a lower side. Furthermore, in some exemplary embodiments, the bump pads 273a, 273b, 273c, and 273d may be omitted. In addition, although a substrate 241 is illustrated in the drawings, in some exemplary embodiments, the substrate 241 may be omitted.

Referring to FIGS. 11, 12A, and 12B, the light emitting device 100a may include a first LED stack 223, a second LED stack 233, a third LED stack 243, and a first transparent electrode 225, a second transparent electrode 235, a third transparent electrode 245, a first n-electrode pad 227a, a second n-electrode pad 237a, a third n-electrode pad 247a, an upper p-electrode pad 237b, a lower p-electrode pad 247b, first to third lower connectors 239a, 239b, and 239c, lower buried vias 255a and 55b, upper buried vias 265a, 65b, 65c, and 65d, a first sidewall insulation layer 253, a second sidewall insulation layer 263, the first to fourth upper connectors 267a, 67b, 67c, and 67d, a first bonding layer 249, a second bonding layer 259, a first surface protection layer 246, a lower insulation layer 248, a second surface protection layer 236, an intermediate insulation layer 238, an upper insulation layer 271, a lower planarization layer 251, an upper planarization layer 261, and bump pads 273a, 73b, 73c, and 73d. Further, the light emitting device 100a may include through holes 223h1, 223h2, 223h3, and 223h4 passing through the first LED stack 223, through holes 233h1 and 233h2 passing through the second LED stack 233, and a capping layer 257. The first LED stack 223 may include an insulation region 237.

As shown in FIGS. 12A and 12B, the first, second, and third LED stacks 223, 233, and 243 according to an exemplary embodiment are stacked in the vertical direction. The first, second, and third LED stacks 223, 233, and 243 may be grown on different growth substrates from one another, and according to the illustrated exemplary embodiment, each of the growth substrates may be removed from the final light emitting device 100a. As such, the light emitting device 100a does not include the growth substrates of the first, second, and third LED stacks 223, 233, and 243. However, the inventive concepts are not limited thereto, and in some exemplary embodiments, at least one of the growth substrates may be included in the light emitting device 100a.

Each of the first LED stack 223, the second LED stack 233, and the third LED stack 243 includes a first conductivity type semiconductor layer 223a, 233a, or 243a, a second conductivity type semiconductor layer 223b, 233b, or 243b, and an active layer interposed therebetween. The active layer may have a multiple quantum well structure.

The second LED stack 233 is disposed under the first LED stack 223, and the third LED stack 243 is disposed under the second LED stack 233. Light generated in the first, second, and third LED stacks 223, 233, and 243 may be emitted to the outside through the third LED stack 243.

In an exemplary embodiment, the first LED stack 223 may emit light having a longer wavelength than those emitted from the second and third LED stacks 233 and 243, and the second LED stack 233 may emit light having a longer wavelength than that emitted from the third LED stack 243. For example, the first LED stack 223 may be an inorganic light emitting diode emitting red light, the second LED stack 233 may be an inorganic light emitting diode emitting green light, and the third LED stack 243 may be an inorganic light emitting diode emitting blue light.

In another exemplary embodiment, to adjust a color mixing ratio of light emitted from the first, second, and third LED stacks 223, 233, and 243, the second LED stack 233 may emit light having a shorter wavelength than that emitted from the third LED stack 243. As such, luminous intensity of light emitted from the second LED stack 233 may be reduced and luminous intensity of light emitted from the third LED stack 243 may be increased. As such, a luminous intensity ratio of light emitted from the first, second, and third LED stacks 223, 233, and 243 may be significantly changed. For example, the first LED stack 223 may be configured to emit red light, the second LED stack 233 may be configured to emit blue light, and the third LED stack 243 may be configured to emit green light.

Hereinafter, although the second LED stack 233 is exemplarily described as emitting light of a shorter wavelength than that emitted from the third LED stack 243, such as blue light, the inventive concepts are not limited thereto. In some exemplary embodiments, the second LED stack 233 may emit light of a longer wavelength than that emitted from of the third LED stack 243, such as green light.

The first LED stack 223 may include an AlGaInP-based well layer, the second LED stack 233 may include an AlGaInN-based well layer, and the third LED stack 243 may include an AlGaInP or AlGaInN-based well layer.

Since the first LED stack 223 emits light of a longer wavelength than that emitted from the second and third LED stacks 233 and 243, light generated in the first LED stack 223 may be emitted to the outside through the second and third LED stacks 233 and 243. In addition, since the second LED stack 233 emits light of a shorter wavelength than that emitted from the third LED stack 243, a portion of light generated in the second LED stack 233 may be absorbed by the third LED stack 243 and lost, and thus, luminous intensity of light generated in the second LED stack 233 may be reduced. Meanwhile, since light generated in the third LED stack 243 is emitted to the outside without passing through the first and second LED stacks 223 and 233, luminous intensity thereof may not be substantially affected by the first and second LED stacks 223 and 233.

The first conductivity type semiconductor layer 223*a*, 233*a* or 243*a* of each of the LED stacks 223, 233, and 243 is an n-type semiconductor layer, and the second conductivity type semiconductor layer 223*b*, 233*b* or 243*b* thereof is a p-type semiconductor layer. In addition, in the illustrated exemplary embodiment, an upper surface of the first LED stack 223 is an n-type semiconductor layer 223*b*, an upper surface of the second LED stack 233 is a p-type semiconductor layer 233*b*, and an upper surface of the third LED stack 243 is a p-type semiconductor layer 243*b*. As such, a stack sequence in the first LED stack 223 is different from those in the second LED stack 233 and the third LED stack 243. The semiconductor layers of the second LED stack 233 are stacked in the same order as the semiconductor layers of the third LED stack 243, and thus, process stability may be ensured.

The second LED stack 233 may include a mesa etching region in which the second conductivity type semiconductor layer 233*b* and the active layer are removed to expose an upper surface of the first conductivity type semiconductor layer 233*a*. A mesa including the second conductivity type semiconductor layer 233*b* and an active layer may be disposed on a partial region of the first conductivity type semiconductor layer 233*a* by the mesa etching region. The upper surface of the first conductivity type semiconductor layer 233*a* may be exposed along a periphery of the mesa, and thus, the mesa may be disposed in an inner side of a region surrounded by an edge of the first conductivity type semiconductor layer 233*a*. Meanwhile, as shown in FIGS. 11 and 12B, the second n-electrode pad 237*a* may be disposed on the first conductivity type semiconductor layer 233*a* exposed to the mesa etching region.

The third LED stack 243 may also include a mesa etching region exposing an upper surface of the first conductivity type semiconductor layer 243*a* by removing the second conductivity type semiconductor layer 243*b* and the active layer, and a mesa including the second conductivity type semiconductor layer 243*b* and an active layer may be disposed on a partial region of the first conductivity type semiconductor layer 243*a* by the mesa etching region. In addition, the upper surface of the first conductivity type semiconductor layer 243*a* may be exposed along a periphery of the mesa, and thus, the mesa may be disposed in an inner side of a region surrounded by an edge of the first conductivity type semiconductor layer 243*a*. Further, the third n-electrode pad 247*a* may be disposed on the first conductivity type semiconductor layer 243*a* exposed to the mesa etching region.

However, the first LED stack 223 may not include a mesa etching region. As such, an external size of the first LED stack 223 may be larger than that of the second LED stack 233 or the third LED stack 243 as shown in FIGS. 12A and 12B. In addition, the insulation region 237 is formed along an edge of the first LED stack 223. The insulation region 237 may be formed over the entire thicknesses of the first conductivity type semiconductor layer 223*a* and the second conductivity type semiconductor layer 223*b*, but the inventive concepts are not limited thereto. As in the insulation region 37 described above, the insulation region 237 according to the illustrated exemplary embodiment may also be formed by ion implantation.

The third LED stack 243 may have a flat lower surface, but the inventive concepts are not limited thereto. For example, the third LED stack 243 may include a concave-convex pattern on a surface of the first conductivity type semiconductor layer 243*a*. In this manner, light extraction efficiency may be improved by the concave-convex pattern. The surface concave-convex pattern in the first conductivity type semiconductor layer 243*a* may be formed when separating a patterned sapphire substrate, but the inventive concepts are not limited thereto. In some exemplary embodiments, the surface concave-convex pattern may be formed by texturing the first conductivity type semiconductor layer 243*a* after separating the growth substrate. The second LED stack 233 may also have the first conductivity type semiconductor layer 233*a* having a textured surface.

In the illustrated exemplary embodiment, the first LED stack 223, the second LED stack 233, and the third LED stack 243 may be overlapped with one another, and may have a light emitting area of substantially similar size. However, the light emitting areas of the first, second, and third LED stacks 223, 233, and 243 may be adjusted by the mesa etching region, the through holes 223*h*1, 223*h*2, 223*h*3, and 223*h*4, and the through holes 233*h*1 and 233*h*2. For example, the light emitting areas of the first and third LED stacks 223 and 243 may be larger than that of the second LED stack 233. As such, luminous intensity of light generated in the first LED stack 223 or the third LED stack 243 may be further increased than that of light generated in the second LED stack 233.

The first transparent electrode 225 may be disposed between the first LED stack 223 and the second LED stack 233. The first transparent electrode 225 is in ohmic contact with the second conductivity type semiconductor layer 223*b* of the first LED stack 223 and transmits light generated in the first LED stack 223. The first transparent electrode 225 may be formed using a transparent oxide layer, such as indium tin oxide (ITO) or a metallic layer. The first transparent electrode 225 may cover substantially an entire surface of the second conductivity type semiconductor layer 223*b* of the first LED stack 223, and a side surface thereof may be disposed to be flush with a side surface of the first LED stack 223. In particular, a side surface of the first transparent electrode 225 may not be covered with the second bonding layer 259. Furthermore, the through holes 223*h*1, 223*h*2, and 223*h*3 may pass through the first transparent electrode 225, and thus, the first transparent electrode 225 may be exposed to sidewalls of the through holes 223*h*1, 223*h*2, and 223*h*3. Meanwhile, the through hole 223*h*4 may expose an upper surface of the first transparent electrode 225. However, the inventive concepts are not limited thereto, and in some exemplary embodiments, the first transparent electrode 225 may be partially removed along an edge of the first LED stack 223, so that the side surface of the first transparent electrode 225 may be covered with the second bonding layer 259. In addition, since the first transparent electrode 225 may be removed by patterning in advance in a region where the through holes 223h1, 223h2, and 223h3 are to be formed, the first transparent electrode 225 may be prevented from being exposed to sidewalls of the through holes 223h1, 223h2, and 223h3.

The second transparent electrode 235 is in ohmic contact with the second conductivity type semiconductor layer 233b of the second LED stack 233. As shown in the drawing, the second transparent electrode 235 contacts the upper surface of the second LED stack 233 between the first LED stack 223 and the second LED stack 233. The second transparent electrode 235 may be formed of a metallic layer or a conductive oxide layer that is transparent to red light. The conductive oxide layer may include $SnO_2$, $InO_2$, ITO, ZnO, IZO, or the like. In particular, since ZnO has favorable electrical and optical characteristics as compared with the metallic layer or other conductive oxide layers, the second transparent electrode 235 may be formed of ZnO, which may be formed as a single crystal on the second LED stack 233. Moreover, since ZnO has a strong adhesion to the second LED stack 233, reliability of the light emitting device may be improved.

The second transparent electrode 235 may be partially removed along an edge of the second LED stack 233, and accordingly, an outer side surface of the second transparent electrode 235 may be covered with the second surface protection layer 236 and/or the intermediate insulation layer 238. More particularly, the side surface of the second transparent electrode 235 may be recessed inwardly than that of the second LED stack 233, and a region where the second transparent electrode 235 is recessed may be filled with the second surface protection layer 236, the intermediate insulation layer 238, and/or the second bonding layer 259. Meanwhile, the second transparent electrode 235 may also be recessed near the mesa etching region of the second LED stack 233, and the recessed region may be filled with the second surface protection layer 236, the intermediate insulation layer 238, or the second bonding layer 259.

The third transparent electrode 245 is in ohmic contact with the second conductivity type semiconductor layer 243b of the third LED stack 243. The third transparent electrode 245 may be disposed between the second LED stack 233 and the third LED stack 243, and contacts the upper surface of the third LED stack 243. The third transparent electrode 245 may be formed of a metallic layer or a conductive oxide layer that is transparent to red light and green light. For example, the conductive oxide layer may include $SnO_2$, $InO_2$, ITO, ZnO, IZO, or the like. In particular, since ZnO may have favorable electrical and optical characteristics as compared with the metallic layer or other conductive oxide layers, the third transparent electrode 245 may be formed of ZnO, which may be formed as a single crystal on the third LED stack 243. In addition, since ZnO has a strong adhesion to the third LED stack 243, reliability of the light emitting device may be improved.

The third transparent electrode 245 may be partially removed along an edge of the third LED stack 243, and accordingly, an outer side surface of the third transparent electrode 245 may not be exposed to the outside, but covered with the first surface protection layer 246, the lower insulation layer 248, or the first bonding layer 249. In particular, the side surface of the third transparent electrode 245 may be recessed inwardly than that of the third LED stack 243, and a region where the third transparent electrode 245 is recessed may be filled with the first surface protection layer 246, the lower insulation layer 248, and/or the first bonding layer 249. The third transparent electrode 245 may also be recessed near the mesa etching region of the third LED stack 243, and the recessed region may be filled with the first surface protection layer 246, the lower insulation layer 248, or the first bonding layer 249.

As the second transparent electrode 235 and the third transparent electrode 245 are recessed as described above, the side surfaces of the second transparent electrode 235 and the third transparent electrode 245 may be prevented from being exposed to an etching gas, thereby improving the production yield of the light emitting device 100a.

According to an exemplary embodiment, the second transparent electrode 235 and the third transparent electrode 245 may include the same conductive oxide layer, for example, ZnO, and the first transparent electrode 225 may include a conductive oxide layer different from the second and third transparent electrodes 35 and 45, such as ITO. However, the inventive concepts are not limited thereto, and in some exemplary embodiments, each of the first, second, and third transparent electrodes 225, 235, and 245 may include the same or different materials.

The first n-electrode pad 227a is in ohmic contact with the first conductivity type semiconductor layer 223a of the first LED stack 223. The first n-electrode pad 227a may include, for example, AuGe or AuTe.

The second n-electrode pad 237a is in ohmic contact with the first conductivity type semiconductor layer 233a of the second LED stack 233. The second n-electrode pad 237a may be disposed on the first conductivity type semiconductor layer 233a exposed by mesa etching. The second n-electrode pad 237a may be formed of, for example, Cr/Au/Ti.

The third n-electrode pad 247a is in ohmic contact with the first conductivity type semiconductor layer 243a of the third LED stack 243. The third n-electrode pad 247a may be disposed on the first conductivity type semiconductor layer 243a exposed through the second conductivity type semiconductor layer 243b, that is, in the mesa etching region. The third n-electrode pad 247a may be formed of, for example, Cr/Au/Ti. An upper surface of the third n-electrode pad 247a may be placed higher than that of the second conductivity type semiconductor layer 243b, and further, higher than that of the third transparent electrode 245. For example, a thickness of the third n-electrode pad 247a may be about 2 μm or more. The third n-electrode pad 247a may have substantially a truncated cone shape, but the inventive concepts are not limited thereto. In other exemplary embodiments, the third n-electrode pad 247a may have various shapes, such as a truncated square pyramid, a cylindrical shape, or a square cylindrical shape.

The upper p-electrode pad 237b may be disposed on the second transparent electrode 235. The upper p-electrode pad 237b may be disposed in openings formed in the first planarization layer 251 and the second surface protection layer 236. The upper p-electrode pad 237b may include substantially the same material as the second n-electrode pad 237a, but the inventive concepts are not limited thereto.

The lower p-electrode pad 247b may include substantially the same material as the third n-electrode pad 247a. However, an upper surface of the lower p-electrode pad 247b may be located at substantially the same elevation as the third n-electrode pad 247a, and, accordingly, a thickness of the lower p-electrode pad 247b may be less than that of the third n-electrode pad 247a. More particularly, the thickness of the lower p-electrode pad 247b may be approximately equal to a thickness of a portion of the third n-electrode pad 247a protruding above the third transparent electrode 245. For example, the thickness of the lower p-electrode pad 247b may be about 1.2 µm or less. The upper surface of the lower p-electrode pad 247b is located at substantially the same elevation as that of the third n-electrode pad 247a, and thus, the lower p-electrode pad 247b and the third n-electrode pad 247a may be simultaneously exposed when the through holes 233h1 and 233h2 are formed. When the elevations of the third n-electrode pad 247a and the lower p-electrode pad 247b are different, any one of the electrode pads may be severely damaged during the etching process. As such, the elevations of the third n-electrode pad 247a and the lower p-electrode pad 247b are set to be approximately equal to prevent any one of the electrode pads from being severely damaged during the etching process or the like.

The first surface protection layer 246 may cover a side surface of the mesa to prevent non-radiative recombination from occurring on the side surface of the mesa of the third LED stack 243. The side surface of the mesa may include surface defects which may be formed during the mesa etching process, and thus, non-radiative recombination is likely to occur on the side surface of the mesa. Moreover, when the light emitting device 100a includes a micro LED having a small light emitting area, light extraction efficiency may be significantly deteriorated due to non-radiative recombination generated at the side surface. As such, according to an exemplary embodiment, chemical treatment may be performed after the mesa etching process to remove surface defects, and the exposed side surface may be covered with the first surface protection layer 246 to prevent non-radiative recombination. Surface treatment on the side surface of the mesa of the third LED stack 243 may be performed using, for example, a chlorine-based diluted solution such as HCl, $FeCl_3$ or the like, or a basic solution such as KOH, tetramethylammonium hydroxide (TMAH), NaOH, or the like. The first surface protection layer 246 may cover the second conductivity type semiconductor layer 243b, the active layer, and the first conductivity type semiconductor layer 243a exposed to the side surface of the mesa. The first surface protection layer 246 may be formed using an atomic layer deposition technique, a low pressure chemical deposition technique, or a plasma enhanced chemical deposition technique, and may be formed of, for example, $Al_2O_3$, SiNx, or $SiO_2$.

The first surface protection layer 246 may cover the third transparent electrode layer 245 along with the side surface of the mesa, as well as the upper surface of the first conductivity type semiconductor layer 243a exposed to the mesa etching region. In the illustrated exemplary embodiment, the first surface protection layer 246 is disposed above the first conductivity type semiconductor layer 243a exposed to the mesa etching region, and thus, the side surface of the first conductivity type semiconductor layer 243a disposed under the mesa of the third LED stack 243 is not covered with the first surface protection layer 246. However, the inventive concepts are not limited thereto, and in another exemplary embodiment, the first surface protection layer 246 may cover the side surface of the first conductivity type semiconductor layer 243a.

The first surface protection layer 246 may have an opening exposing the first conductivity type semiconductor layer 243a and an opening exposing the third transparent electrode 245. The third n-electrode pad 247a and the lower p-electrode pad 247b may be disposed in the openings, respectively.

The lower insulation layer 248 covers the upper surface of the third LED stack 243. The lower insulation layer 248 may also cover the first surface protection layer 246 and the third transparent electrode 245, as well as the third n-electrode pad 247a and the lower p-electrode pad 247b. The lower insulation layer 248 may have openings exposing the third n-electrode pad 247a and the lower p-electrode pad 247b. The lower insulation layer 248 may protect the third LED stack 243, the third transparent electrode 245, the third n-electrode pad 247a, and the lower p-electrode pad 247b. Further, the lower insulation layer 248 may include a material capable of improving adhesion to the first bonding layer 249, for example, $SiO_2$. In some exemplary embodiments, the lower insulation layer 248 may be omitted.

The first bonding layer 249 couples the second LED stack 233 to the third LED stack 243. The first bonding layer 249 may be disposed between the first conductivity type semiconductor layer 233a and the third transparent electrode 245. The first bonding layer 249 may contact the lower insulation layer 248, and may partially contact the third n-electrode pad 247a and the lower p-electrode pad 247b. When the lower insulation layer 248 is omitted, the first bonding layer 249 may partially contact the first surface protection layer 246 and the first conductivity type semiconductor layer 243a.

The first bonding layer 249 may be formed of a transparent organic material layer, or may be formed of a transparent inorganic material layer. For example, the organic material layer may include SU8, poly methylmethacrylate (PMMA), polyimide, parylene, benzocyclobutene (BCB), or the like, and the inorganic material layer may include $Al_2O_3$, $SiO_2$, SiNx, or the like. In addition, the first bonding layer 249 may be formed of spin-on-glass (SOG).

The first planarization layer 251 may be disposed on the second LED stack 233. In particular, the first planarization layer 251 is disposed on an upper region of the second conductivity type semiconductor layer 233b and is spaced apart from the mesa etching region.

The through holes 233h1 and 233h2 may pass through the first planarization layer 251, the second LED stack 233, and the first bonding layer 249, and expose the third n-electrode pad 247a and the lower p-electrode pad 247b, respectively.

The first sidewall insulation layer 253 covers sidewalls of the through holes 233h1 and 233h2 and has openings exposing bottoms of the through holes 233h1 and 233h2. The first sidewall insulation layer 253 may be formed using, for example, a chemical vapor deposition technique or an atomic layer deposition technique, and may be formed of, for example, $Al_2O_3$, $SiO_2$, $Si_3N_4$, or the like.

The lower buried vias 255a and 255b may fill the through holes 233h1 and 233h2, respectively. The lower buried vias 255a and 255b are insulated from the second LED stack 233 by the first sidewall insulation layer 253. The lower buried via 255a may be electrically connected to the third n-electrode pad 247a, and the lower buried via 255b may be electrically connected to the lower p-electrode pad 247b.

The lower buried vias 255a and 255b may be formed using a chemical mechanical polishing technique. For example, after forming a seed layer and filling the through holes 233h1 and 233h2 with a conductive material such as Cu using a plating technique, the lower buried vias 255a and 255b may be formed by removing metallic layers on the first planarization layer 251 using the chemical mechanical polishing technique. As shown in FIGS. 12A and 12B, the lower buried vias 255a and 255b may have a relatively wider width at inlets of the through holes 233h1 and 233h2, and thus, the electrical connection may be strengthened.

The lower buried vias 255a and 255b may be formed together through the same process. As such, upper surfaces of the lower buried vias 255a and 255b may be substantially flush with the first planarization layer 251. A detailed process of forming the lower buried vias will be described in more detail later. However, the inventive concepts are not limited thereto, and the lower buried vias may be formed through different processes from each other in other exemplary embodiments.

The capping layers 257 may cover upper surfaces of the lower buried vias 255a and 255b. The capping layers 257 may be formed of a metallic layer and protect the lower buried vias 255a and 255b.

The second surface protection layer 236 covers a side surface of the mesa to prevent non-radiative recombination occurring at the side surface of the mesa of the second LED stack 233. The side surface of the mesa of the second LED stack 233 may include surface defects which may be formed during the mesa etching process. In this case, non-radiative recombination is likely to occur at the surface defects of the mesa of the second LED stack 233. As such, according to an exemplary embodiment, chemical treatment may be performed to remove surface defects after the mesa etching process, and the exposed side surface may be covered with the second surface protection layer 236 to prevent non-radiative recombination. Surface treatment on the side surface of the mesa of the second LED stack 233 may be performed using, for example, a basic etching solution such as KOH, tetramethylammonium hydroxide (TMAH), NaOH, or the like. The second surface protection layer 236 may cover the second conductivity type semiconductor layer 233b, the active layer, and the first conductivity type semiconductor layer 233a exposed to the side surface of the mesa. The second surface protection layer 236 may be formed using an atomic layer deposition technique, a low pressure chemical deposition technique, or a plasma enhanced chemical deposition technique, and may be formed of, for example, $Al_2O_3$, SiNx, or $SiO_2$.

The second surface protection layer 236 may cover the first planarization layer 251 along with the side surface of the mesa of the second LED stack 233, as well as an upper surface of the first conductivity type semiconductor layer 233a exposed to the mesa etching region. In the illustrated exemplary embodiment, the second surface protection layer 236 is disposed above the first conductivity type semiconductor layer 233a exposed to the mesa etching region, and thus, the side surface of the first conductivity type semiconductor layer 233a disposed under the mesa of the second LED stack 233 is not covered with the second surface protection layer 236. However, the inventive concepts are not limited thereto, and in another exemplary embodiment, the second surface protection layer 236 may cover the side surface of the first conductivity type semiconductor layer 233a.

The second surface protection layer 236 may have a plurality of openings to allow electrical connection. The second n-electrode pad 237a and the upper p-electrode pad 237b may be disposed in the openings of the second surface protection layer 236, respectively.

The intermediate insulation layer 238 is formed on the second LED stack 233, and covers the second surface protection layer 236, the upper p-electrode pad 237b, and the second n-electrode pad 237a. The intermediate insulation layer 238 may also cover the mesa etching region of the second LED stack 233. The intermediate insulation layer 238 may have openings exposing the capping layer 257 or the lower buried vias 255a and 255b, the upper p-electrode pad 237b, and the second n-electrode pad 237a. The intermediate insulation layer 238 may be formed of, for example, $SiO_2$. The intermediate insulation layer 238 may protect the second LED stack 233, the upper p-electrode pad 237b, and the second n-electrode pad 237a, and further, improve adhesion of the second bonding layer 259.

The lower connectors 239a, 239b, and 239c may be disposed on the intermediate insulation layer 238. The first lower connector 239a may be electrically connected to the lower buried via 255a, and may also extend in the lateral direction to be electrically connected to the second n-electrode pad 237a. As such, the first conductivity type semiconductor layer 243a of the third LED stack 243 and the first conductivity type semiconductor layer 233a of the second LED stack 233 may be commonly electrically connected. The first lower connector 239a may be electrically connected to the lower buried via 255a through the capping layer 257.

The second lower connector 239b is electrically connected to the lower buried via 255b. As shown in the drawing, the second lower connector 239b may be electrically connected to the lower buried via 255b through the capping layer 257.

The third lower connector 239c is electrically connected to the second transparent electrode 235. The third lower connector 239c may be disposed on the upper p-electrode pad 237b as shown in FIG. 12A, and may be electrically connected to the second transparent electrode 235 through the upper p-electrode pad 237b.

The second bonding layer 259 couples the first LED stack 223 to the second LED stack 233. As shown in the drawing, the second bonding layer 259 may be disposed between the first transparent electrode 225 and the intermediate insulation layer 238. The second bonding layer 259 may also cover the first, second, and third lower connectors 239a, 239b, and 239c. The second bonding layer 259 may include substantially the same material that may form the first bonding layer 249 described above, and thus, repeated descriptions thereof will be omitted to avoid redundancy.

The second planarization layer 261 covers the first LED stack 223. The second planarization layer 261 may be formed of an aluminum oxide layer, a silicon oxide layer, or a silicon nitride layer. The second planarization layer 261 may have an opening exposing the first n-electrode pad 227a.

The through holes 223h1, 223h2, 223h3, and 223h4 pass through the second planarization layer 261 and the first LED stack 223. Further, the through holes 223h1, 223h2, and 223h3 may pass through the first transparent electrode 225 and the second bonding layer 259 to expose the lower connectors 239a, 239b, and 239c, and the through hole 223h4 may expose the first transparent electrode 225. For example, the through hole 223h1 is formed to provide a passage for allowing electrical connection to the lower buried via 255a, the through hole 223h2 is formed to provide a passage for allowing electrical connection to the lower buried via 255b, and the through hole 223h3 is formed to provide a passage for allowing electrical connection to the second transparent electrode 235.

The through hole 223h4 is formed to provide a passage for allowing electrical connection to the first transparent electrode 225. The through hole 223h4 may not pass through the first transparent electrode 225. However, the inventive concepts are not limited thereto, and in some exemplary embodiments, the through hole 223h4 may pass through the first transparent electrode 225 as long as the through hole 223h4 provides the passage for electrical connection to the first transparent electrode 225.

After the through holes 223h1, 223h2, 223h3, and 223h4 are formed, chemical treatment may be performed to remove surface defects formed on inner walls of the through holes 223h1, 223h2, 223h3, and 223h4. The surface of the first LED stack 223 may be treated using, for example, a diluted HF solution, or a diluted Cl solution.

The second sidewall insulation layer 263 covers the sidewalls of the through holes 223h1, 223h2, 223h3, and 223h4. The second sidewall insulation layer 263 has openings exposing the bottoms of the through holes 223h1, 223h2, 223h3, and 223h4. In the exemplary embodiment, the second sidewall insulation layer 263 is not formed on a sidewall of an opening 261a of the second planarization layer 261, but the inventive concepts are not limited thereto. In some exemplary embodiments, the second sidewall insulation layer 263 may also be formed on a sidewall of the opening 261a of the second planarization layer 261. The second sidewall insulation layer 263 may be formed using, for example, a chemical vapor deposition technique or an atomic layer deposition technique, and may be formed of, for example, $Al_2O_3$, $SiO_2$, $Si_3N_4$, or the like.

The upper buried vias 265a, 265b, 265c, and 265d may fill the through holes 223h1, 223h2, 223h3, and 223h4, respectively. The upper buried vias 265a, 265b, 265c, and 265d are electrically insulated from the first LED stack 223 by the second sidewall insulation layer 263.

The upper buried via 265a may be electrically connected to the lower buried via 255a through the first lower connector 239a, the upper buried via 265b may be electrically connected to the lower buried via 255b through the second lower connector 239b, and the upper buried via 265c may be electrically connected to the second transparent electrode 235 through the third lower connector 239c. Also, the upper buried via 265d may be electrically connected to the first transparent electrode 225.

The upper buried vias 265a, 265b, 265c, and 265d may be formed using a chemical mechanical polishing technique. For example, after forming a seed layer and filling the through holes 223h1, 223h2, 223h3, and 223h4 using a plating technique, the upper buried vias 265a, 265b, 265c, and 265d may be formed by removing metallic layers on the second planarization layer 261 using the chemical mechanical polishing technique. In some exemplary embodiments, a metal barrier layer may be further formed before forming the seed layer.

The upper buried vias 265a, 265b, 265c, and 265d may be formed together through a same process to be substantially flush with the second planarization layer 261. However, the inventive concepts are not limited thereto, and the upper buried vias 265a, 265b, 265c, and 265d may be formed through different processes from each other.

The first upper connector 267a, the second upper connector 267b, the third upper connector 267c, and the fourth upper connector 267d are disposed on the second planarization layer 261. The first upper connector 267a may be electrically connected to the upper buried via 265a, the second upper connector 267b may be electrically connected to the upper buried via 265b, the third upper connector 267c may be electrically connected to the upper buried via 265c, and the fourth upper connector 267d may be electrically connected to the upper buried via 265d. As shown in the drawing, the first, second, third, and fourth upper connectors 267a, 267b, 267c, and 267d may cover the upper buried vias 265a, 265b, 265c, and 265d, respectively. Meanwhile, the first upper connector 267a may be electrically connected to the first n-electrode pad 227a through the opening 261a of the second planarization layer 261. In this manner, the first conductivity type semiconductor layers 223a, 233a, 243a of the first, second, and third LED stacks 223, 233, and 243 are commonly electrically connected to one another.

The first upper connector 267a, the second upper connector 267b, the third upper connector 267c, and the fourth upper connector 267d may be formed of substantially the same material, for example, AuGe/Ni/Au/Ti, in the same process.

The upper insulation layer 271 may cover the side and upper surfaces of the first LED stack 223 and the second planarization layer 261, as well as the first to fourth upper connectors 267a, 267b, 267c, and 267d. The upper insulation layer 271 may also cover the side surface of the first transparent electrode 225. Further, the upper insulation layer 271 may cover side surfaces of the first bonding layer 249 and the second bonding layer 259. The second LED stack 233 and the third LED stack 243 may be spaced apart from the upper insulation layer 271 by the bonding layers 249 and 259. However, the inventive concepts are not limited thereto, and in some exemplary embodiments, the upper insulation layer 271 may cover the side surfaces of the second and third LED stacks 233 and 243.

The upper insulation layer 271 may have openings exposing the first upper connector 267a, the second upper connector 267b, the third upper connector 267c, and the fourth upper connector 267d. The openings of the upper insulation layer 271 may be generally disposed on flat surfaces of the first upper connector 267a, the second upper connector 267b, the third upper connector 267c, and the fourth upper connector 267d. The upper insulation layer 271 may be formed of a silicon oxide layer or a silicon nitride layer, and may be formed to be thinner than the second planarization layer 261, for example, to about 400 nm thick.

Each of the bump pads 273a, 273b, 273c, and 273d may be disposed on and electrically connected to the first upper connector 267a, the second upper connector 267b, and the third upper connector 267c, and the fourth upper connector 267d, respectively. The bump pads 273a, 273b, 273c, and 273d may be disposed in the openings of the upper insulation layer 271, and may be formed to seal the openings as shown in the drawings.

The first bump pad 273a is electrically connected to the upper buried vias 265a and the first n-electrode pad 227a through the first upper connector 267a, and accordingly, commonly electrically connected to the first conductivity type semiconductor layers 223a, 233a, 243a of the LED stacks 223, 233, and 243.

The second bump pad 273b may be electrically connected to the second conductivity type semiconductor layer 243b of the third LED stack 243 through the second upper connector 267b, the upper buried via 265b, the second lower connector 239b, the lower buried via 255b, the lower p-electrode pad 247b, and the third transparent electrode 245.

The third bump pad 273c may be electrically connected to the second conductivity type semiconductor layer 233b of the second LED stack 233 through the third upper connector 267c, the upper buried via 265c, the third lower connector 239c, the upper p-electrode pad 237b, and the second transparent electrode 235.

The fourth bump pad 273d may be electrically connected to the second conductivity type semiconductor layer 223b of the first LED stack 223 through the fourth upper connector 267d and the first transparent electrode 225.

As such, each of the second to fourth bump pads 273b, 273c, and 273d is electrically connected to the second conductivity type semiconductor layers 223b, 233b, and 243b of the first, second, and third LED stacks 223, 233, and 243, and the first bump pad 273a is commonly electrically connected to the first conductivity type semiconductor layers 223a, 233a, and 243a of the first, second, and third LED stacks 223, 233, and 243.

The bump pads 273a, 273b, 273c, and 273d may cover the openings of the upper insulation layer 271, and portions of the bump pads 273a, 273b, 273c, and 273d may be disposed on the upper insulation layer 271. Alternatively, the bump pads 273a, 273b, 273c, and 273d may be disposed in openings 271a.

The bump pads 273a, 273b, 273c, and 273d may be formed of Au/In. For example, Au may be formed to have a thickness of about 3 μm, and In may be formed to have a thickness of about 1 μm. The light emitting device 100a may be bonded to pads on a circuit board 1001 using In. In the illustrated exemplary embodiment, the light emitting device 100a is described as being bonded to the pads using In, but the inventive concepts are not limited thereto, and in some exemplary embodiments, the light emitting device 100a may be bonded to the pads using Pb or AuSn.

According to the illustrated exemplary embodiment, the first LED stack 223 is electrically connected to the bump pads 273a and 273d, the second LED stack 233 is electrically connected to the bump pads 273a and 273c, and the third LED stack 243 is electrically connected to the bump pads 273a and 273b. Accordingly, cathodes of the first LED stack 223, the second LED stack 233, and the third LED stack 243 are commonly electrically connected to the first bump pad 273a, and anodes thereof are electrically connected to the second to fourth bump pads 273b, 273c, and 273d, respectively. In this manner, the first, second, and third LED stacks 223, 233, and 243 may be driven independently.

In the illustrated exemplary embodiment, although the light emitting device 100a has been described as including bump pads 273a, 273b, 273c, and 273d, but the inventive concepts are not limited thereto. In some exemplary embodiments, the bump pads may be omitted. In particular, when bonded to the circuit board 1001 using an anisotropic conductive film or anisotropic conductive paste, the bump pads may be omitted, and upper connectors 267a, 267b, 267c, and 267d may be directly bonded to the circuit board 1001. As such, a bonding area may be increased.

In the illustrated exemplary embodiment, each of the second LED stack 233 and the third LED stack 243 is exemplarily described as including the mesa, but in some exemplary embodiments, the second LED stack 233 and the third LED stack 243 may not include the mesa. In this case, each of the first surface protection layer 246 and the second surface protection layer 236 may at least partially cover the side surface of the third LED stack 243 and the side surface of the second LED stack 233 to prevent non-radiative recombination.

In the exemplary embodiment, the first LED stack 223 is exemplarily described as including the insulation region 237 to prevent non-radiative surface recombination, but as in the above-described exemplary embodiments, the first LED stack 223 may alternatively include an oxidation region forming layer 39 having an oxidation region 39x.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
   a circuit board including a conductive pattern;
   a first emitter, a second emitter, and a third emitter disposed on the circuit board;
   an insulation layer disposed on the circuit board; and
   a plurality of adjustment layers disposed on the circuit board, and including a first adjustment layer, a second adjustment layer, and a third adjustment layer,
   wherein:
   the first emitter is surrounded by the first adjustment layer;
   the second emitter is surrounded by the second adjustment layer;
   the third emitter is surrounded by the third adjustment layer; and
   each of the adjustment layers includes a concave-convex pattern along an edge of the corresponding adjustment layer.

2. The display apparatus of claim 1, wherein:
   the concave-convex pattern includes a concave portion having a depth and a width or a convex portion having a depth and width in a top view.

3. The display apparatus of claim 2, wherein the adjustment layers expose an upper surface of the insulation layer.

4. The display apparatus of claim 3, wherein:
   each of the adjustment layers includes an open region exposing a corresponding one of the first, second, and third emitters.

5. The display apparatus of claim 1, wherein the insulation layer includes a white material.

6. The display apparatus of claim 5, wherein the insulation layer is disposed between the circuit board and the adjustment layers, and the insulation layer includes openings for each of the first, second, and third emitters to electrically connect to the conductive pattern of the circuit board.

7. The display apparatus of claim 6, wherein the first, second, and third emitters are arranged linearly.

8. The display apparatus of claim 1, wherein:
   the concave-convex pattern includes a concave portion having a depth and a width or a convex portion having a depth and width in a top view.

9. The display apparatus of claim 8, wherein the adjustment layers expose an upper surface of the insulation layer.

10. The display apparatus of claim 9, wherein:
    each of the adjustment layers includes an open region exposing a corresponding one of the first, second, and third emitters.

11. A display apparatus, comprising:
    a circuit board including a conductive pattern;
    a first emitter, a second emitter, and a third emitter disposed on the circuit board;
    an insulation layer disposed on the circuit board; and
    a first adjustment layer, a second adjustment layer, and a third adjustment layer disposed on the circuit board,
    wherein:
    the first emitter is exposed by the first adjustment layer;
    the second emitter is exposed by the second adjustment layer;
    the third emitter is exposed by the third adjustment layer; and
    each of the adjustment layers includes a concave-convex pattern along an edge of the corresponding adjustment layer.

12. The display apparatus of claim 11, wherein the insulation layer includes a white material.

13. The display apparatus of claim 12, wherein the insulation layer is disposed between the circuit board and the adjustment layers, and the insulation layer includes openings for each of the first, second, and third emitters to electrically connect to the conductive pattern of the circuit board.

14. The display apparatus of claim 13, wherein the first, second, and third emitters are arranged linearly.

15. A display apparatus, comprising:
a circuit board including a conductive pattern;
a first emitter, a second emitter, and a third emitter disposed on the circuit board;
an insulation layer disposed on the circuit board; and
a first adjustment layer, a second adjustment layer, and a third adjustment layer disposed on the circuit board, wherein:
the first emitter is exposed by the first adjustment layer;
the second emitter is exposed by the second adjustment layer;
the third emitter is exposed by the third adjustment layer; and
each of the adjustment layers includes a concave edge region and a convex edge region.

16. The display apparatus of claim 15, wherein:
the concave edge region includes a concave portion having a depth and a width, and the convex edge region includes a convex portion having a depth and width in a top view.

17. The display apparatus of claim 16, wherein the adjustment layers expose an upper surface of the insulation layer.

18. The display apparatus of claim 17, wherein:
each of the adjustment layers includes an open region exposing a corresponding one of the first, second, and third emitters.

19. The display apparatus of claim 15, wherein the insulation layer includes a white material.

20. The display apparatus of claim 19, wherein the insulation layer is disposed between the circuit board and the adjustment layers, and the insulation layer includes openings for each of the first, second, and third emitters to electrically connect to the conductive pattern of the circuit board.

* * * * *